United States Patent [19]
Mizohata et al.

[11] Patent Number: 5,638,687
[45] Date of Patent: Jun. 17, 1997

[54] SUBSTRATE COOLING METHOD AND APPARATUS

[75] Inventors: Yasuhiro Mizohata; Minobu Matsunaga, both of Kyoto, Japan

[73] Assignee: Dainippon Screen Mfg. Co., Ltd., Japan

[21] Appl. No.: 560,526

[22] Filed: Nov. 17, 1995

[30] Foreign Application Priority Data

Nov. 21, 1994 [JP] Japan .................................. 6-312683
Jan. 30, 1995 [JP] Japan .................................. 7-034232

[51] Int. Cl.$^6$ .................................................. H01L 21/02
[52] U.S. Cl. ................................ 62/62; 62/65; 236/78 D
[58] Field of Search ............................ 62/3.2, 3.3, 3.7, 62/62, 65, 161, 164, 190; 236/78 D

[56] References Cited

U.S. PATENT DOCUMENTS 3,111,008  11/1963  Nelson .................................. 62/3.3
3,438,214   4/1969  Schmittle ............................. 62/3.7
5,411,076   5/1995  Matsunaga et al. ................ 165/80.2

FOREIGN PATENT DOCUMENTS 102047  6/1983  Japan ............................. 236/78 D

*Primary Examiner*—William Doerrler
*Attorney, Agent, or Firm*—Ostrolenk, Faber, Gerb & Soffen, LLP

[57] ABSTRACT

In a substrate cooling apparatus for cooling a substrate placed on or adjacent a cooling plate having Peltier elements, the substrate is cooled quickly by controlling the Peltier elements to cool the cooling plate to a second set temperature below a target temperature to which the substrate is to be cooled, and switching control of the Peltier elements at a predetermined time after the substrate is placed on or adjacent the cooling plate, to increase the temperature of the cooling plate to the target temperature. Alternatively, the substrate may be cooled quickly by controlling the Peltier elements to cool the cooling plate to a predetermined temperature, controlling the Peltier elements at a normalized maximum cooling output when the substrate is placed on or adjacent the cooling plate, determining, when the cooling plate reaches a peak of temperature increase, a lower limit temperature related to the peak of temperature increase, and switching control of the Peltier elements, when the cooling plate reaches the lower limit temperature, to bring the cooling plate to the target temperature.

19 Claims, 22 Drawing Sheets

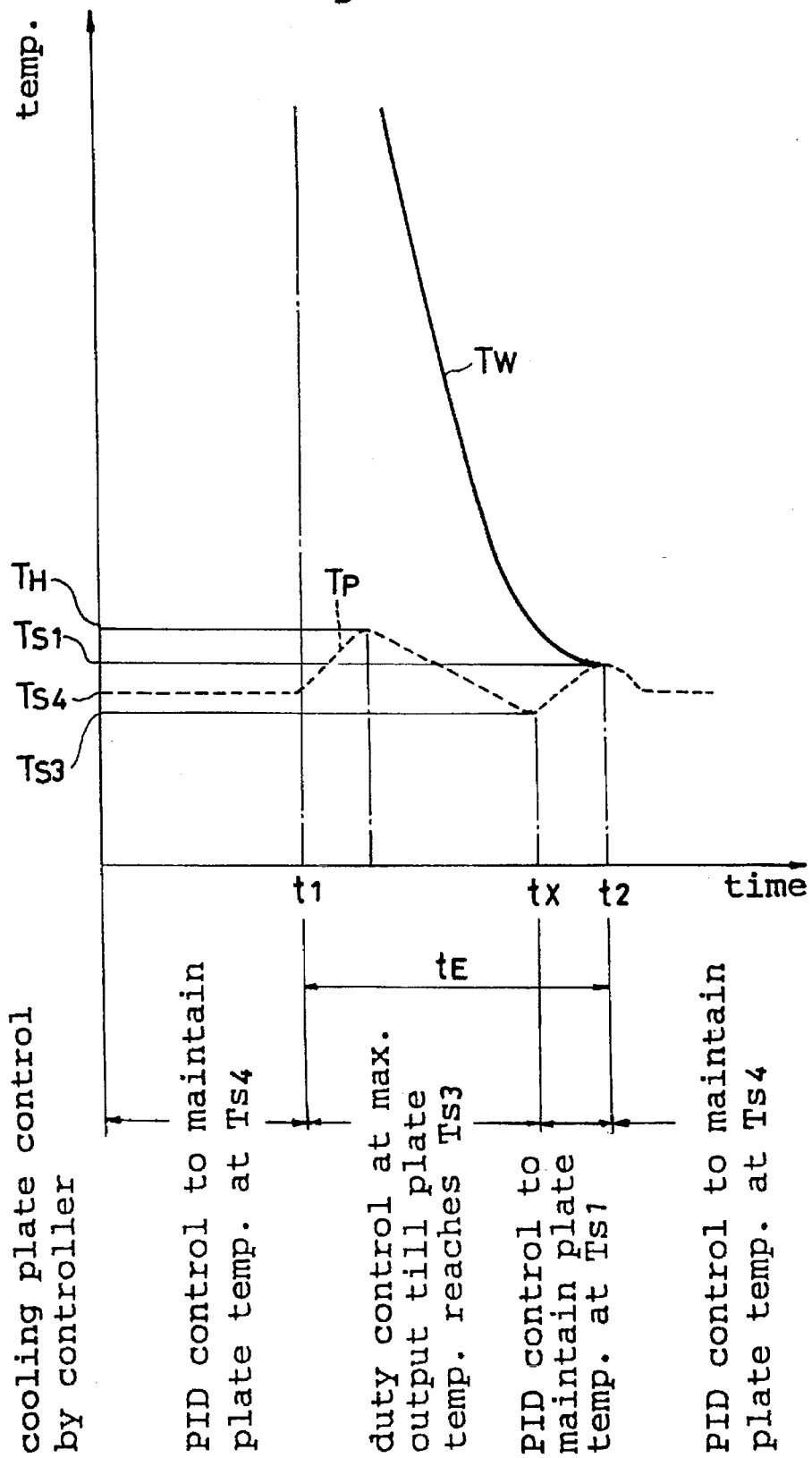

SUBSTRATE COOLING METHOD AND APPARATUS

BACKGROUND OF THE INVENTION

(1) Field of the Invention

The present invention relates to methods and apparatus for cooling substrates, such as semiconductor wafers, glass substrates for photomasks, glass substrates for liquid crystal displays or substrates for optical disks. Specifically, substrates having been heated to a high temperature are placed on or adjacent a cooling plate having a cooling device to be cooled to a target temperature that is approximately room temperature before and after a step of photoresist application or development during a photolithographic process.

(2) Description of the Related Art

A conventional example of substrate cooling apparatus of the type noted above is illustrated in FIG. 1. This apparatus includes a treating chamber 100 housing a heat conduction plate 101, Peltier elements 102 and a radiating plate 103 constituting a cooling plate assembly 104, a plurality of substrate support pins 105 arranged to be vertically movable through perforations 104a formed in the cooling plate assembly 104, and an air cylinder 106 for raising and lowering the substrate support pins 105. For cooling a hot substrate or wafer W, a substrate transport robot (not shown) places the wafer W on the substrate support pins 105 in a raised position. Then, the support pins 105 are lowered so that the wafer W rests on the cooling plate assembly 104. At this time, the Peltier elements 102 are driven under proportional-plus-integral-plus-derivative (PID) control or the like whereby, as shown in the time chart of FIG. 2, the temperature Tp of cooling plate assembly 104 is maintained equal to target temperature Ts to which the wafer W is to be cooled.

However, with this substrate cooling apparatus, as shown in FIG. 2, when hot wafer W is placed on the cooling plate assembly 104 at cooling starting time t1, plate temperature Tp is temporarily raised by wafer temperature Tw. At this time, the Peltier elements 102 of the cooling plate assembly 104 are subjected to PID control to become target temperature Ts. However, since there is a limitation to the cooling capacity of Peltier elements 102, it is inevitable that the cooling plate assembly 104 is temporarily heated above target temperature Ts. Thus, a long time tp is consumed before plate temperature Tp returns to target temperature Ts, which in turn requires a long time tw for cooling the wafer W to target temperature Ts. This results in the disadvantage that the apparatus has low throughput.

SUMMARY OF THE INVENTION

The present invention has been made having regard to the state of the art noted above, and its object is to provide a substrate cooling method and apparatus for cooling substrates quickly to realize a reduced cooling time.

Another object of the invention is to provide a substrate cooling method and apparatus for cooling substrates efficiently.

The above objects are fulfilled, in a first aspect of the present invention, by a substrate cooling method for cooling a substrate placed in position contacting or adjacent a cooling plate having a cooling device, the method comprising the steps of:

controlling the cooling device to cool the cooling plate such that, by a point of time when the substrate is placed in position, the cooling plate is maintained below a target temperature to which the substrate is to be cooled; and switching control of the cooling device at a predetermined time after the substrate is placed in position, to increase the temperature of the cooling plate to the target temperature.

According to the method in the first aspect of the invention noted above, before a substrate is placed on or adjacent the cooling plate, the cooling device is controlled to cool the cooling plate to a temperature below the target temperature to which the substrate is to be cooled. Next, the substrate is placed on or adjacent the cooling plate, and a substrate cooling operation is started. Since the cooling plate is set to the temperature below the target temperature at this time, there occurs a greater difference between plate temperature and wafer temperature than when the cooling plate is set to the target temperature. Thus, the substrate is cooled quickly toward the temperature below the target temperature. Then, at a predetermined time after the substrate is placed on or adjacent the cooling plate, the cooling device is switched to increase the temperature of the cooling plate to the target temperature. Consequently, the substrate is cooled quickly to the target temperature without being cooled therebelow. With the substrate cooled to the target temperature in a reduced time, the entire substrate cooling treatment has improved throughput.

In the above method, the predetermined time for switching the cooling plate from the lower temperature to the target temperature may be set to a point of time when the temperature of the cooling plate reaches a peak of temperature increase, or a point of time when a predetermined period of time elapses, after the substrate is placed on or adjacent the cooling plate. Alternatively, the predetermined time may be set to a point of time when placement of the substrate in position is detected.

Where the predetermined time is set to the point of time when the temperature of the cooling plate reaches a peak of temperature increase after the substrate is placed in position, the temperature of the cooling plate is restored quickly to cool the substrate quickly.

Where the predetermined time is set to the point of time when a predetermined period of time elapses after the substrate is placed in position, it is unnecessary to keep track of the temperature of the cooling plate, whereby the substrate may be cooled quickly in a simple control mode.

Where the predetermined time is set to the point of time when placement of the substrate in position is detected, the substrate may be cooled quickly under a relatively simple control.

The method in the first aspect of the invention may further comprise the step of inputting an initial temperature of the substrate to be cooled, wherein the temperature below the target temperature is determined in relation to the initial temperature.

In this method, upon input of the initial temperature of the substrate to be cooled, a temperature value related to this initial temperature is adopted as the temperature below the target temperature. The cooling device is controlled to cool the cooling plate to the temperature thus determined, by the time the substrate is placed on or adjacent the cooling plate. The cooling plate is cooled prior to placement of the substrate, according to the initial temperature of the substrate even if the initial temperature is varied. The substrate is cooled quickly toward the temperature determined as above. For example, when treating a plurality of substrates having varied initial temperatures, these substrates may reach the target temperature in substantially the same time. This feature facilitates control of an apparatus used.

The method in the first aspect of the invention may be executed with the following apparatus.

That is, a substrate cooling apparatus for cooling a substrate placed in position contacting or adjacent a cooling plate having a cooling device, in the first aspect of the invention, comprises a controller for controlling the cooling device to cool the cooling plate such that, by a point of time when the substrate is placed in position, the cooling plate is maintained below a target temperature to which the substrate is to be cooled, and for switching control of the cooling device at a predetermined time after the substrate is placed in position, to increase the temperature of the cooling plate to the target temperature.

In a second aspect of the invention, there is provided a substrate cooling method for cooling a substrate placed in position contacting or adjacent a cooling plate having a cooling device, the method comprising the steps of:

controlling the cooling device to cool the cooling plate such that, before the substrate is placed in position, the cooling plate is maintained at a predetermined temperature;

controlling the cooling device at a predetermined high cooling output at a point of time when the substrate is placed in position;

determining, when the cooling plate reaches a peak of temperature increase, a lower limit temperature related to the peak of temperature increase and below a target temperature to which the substrate is to be cooled; and switching control of the cooling device, when the cooling plate reaches the lower limit temperature, to increase the temperature of the cooling plate to the target temperature.

According to the method in the second aspect of the invention, before a substrate is placed on or adjacent the cooling plate, the cooling plate is cooled to a predetermined temperature. When the substrate is placed on or adjacent the cooling plate, the cooling device is driven at a predetermined high cooling output to cool the cooling plate to a temperature below the target temperature to which the substrate is to be cooled. Thus, the substrate placed in position is cooled quickly toward the temperature below the target temperature.

When the cooling plate reaches the peak of temperature increase, a lower limit temperature related to the peak of temperature increase is determined. When the cooling plate reaches the lower limit temperature subsequently, the control of the cooling device is switched to bring the temperature of the cooling plate to the target temperature. As a result, the temperature of the cooling plate increases and that of the substrate decreases toward the target temperature. The temperatures of the cooling plate and the substrate reach the target temperature substantially at the same time. Thus, a large temperature difference occurs between the cooling plate and the substrate before reaching the target temperature, and the substrate is cooled quickly to the target temperature without being cooled therebelow.

With the substrate cooled to the target temperature in a reduced time, the entire substrate cooling treatment has improved throughput.

Since the value related to the peak of temperature increase is used as the lower limit temperature below the target temperature, the lower limit temperature is determined in a way to accommodate variations in the peak of temperature increase resulting from varied conditions such as of the initial temperature or size of the substrate. Thus, different substrates are cooled quickly to the target temperature according to varied conditions, and the cooling time needed to reach the target temperature is made substantially invariable. This feature promotes stability of substrate quality.

In the method according to the second aspect, the predetermined temperature at which the cooling plate is maintained before the substrate is placed in position may be the target temperature, or may be a preliminary cooling temperature below the target temperature.

Where the predetermined temperature is the target temperature, substrates may be cooled successively by maintaining the target temperature without switching the control of the cooling device. With the control of the cooling device switched a minimal number of times, substrates may be cooled quickly in a relatively simple control mode. When a plurality of substrates in the same condition are cooled, the temperature of the cooling plate at a cooling starting time may be conformed to the target temperature, thereby to cool all the substrates under uniform conditions.

Where the predetermined temperature is the preliminary cooling temperature below the target temperature, a greater temperature difference occurs between cooling plate and substrate than when the cooling plate is set to the target temperature at a cooling starting time. Consequently, the substrate may be cooled quickly in the initial stage of cooling treatment. When a plurality of substrates in the same condition are cooled, the temperature of the cooling plate at the cooling starting time may be conformed to the preliminary cooling temperature, thereby to cool all the substrates under uniform conditions.

In the method according to the second aspect of the invention, the cooling device may comprise Peltier elements, the Peltier elements being controlled at the predetermined high cooling output at the point of time when the substrate is placed in position, by an electric current outputted to the Peltier elements in pulses under ON/OFF control with a duty ratio determined based on a maximum cooling power of the Peltier elements for a maximum temperature of radiating water supplied to a radiating plate disposed at a radiating side of the Peltier elements, and on a reference electric current outputted to the Peltier elements for driving the Peltier elements at the maximum cooling power at the maximum temperature of the radiating water, such that the duty ratio, with respect to the reference electric current, of an electric current required to drive the Peltier elements at the maximum cooling power at a measured temperature of radiating water actually supplied to the radiating plate is determined from a ratio between heat absorption of the radiating plate at the measured temperature of the radiating water and heat absorption of the radiating plate at the maximum temperature of the radiating water.

In the above method, the Peltier elements may be driven at the maximum cooling output in a uniform manner even with variations in the radiating water temperature.

The method in the second aspect of the invention may be executed with the following apparatus.

That is, a substrate cooling apparatus for cooling a substrate placed in position contacting or adjacent a cooling plate having a cooling device, in the second aspect of the invention, comprises:

a temperature measuring unit for detecting temperature of the cooling plate;

a peak sensor for detecting a peak of the temperature of the cooling plate detected by the temperature measuring unit;

a first set temperature storage for storing a target temperature, as a first set temperature, to which the substrate is to be cooled;

a lower limit temperature storage for storing peak temperatures of said cooling plate at peaks of temperature increase reached after the substrate is placed in position, and lower limit temperatures below the target temperature and related to the peak temperatures; and a controller for controlling the cooling device to cool the cooling plate to a predetermined temperature before the substrate is placed in position, controlling the cooling device at a predetermined high cooling output at a point of time when the substrate is placed in position, reading a lower limit temperature related to a peak temperature from the lower limit temperature storage when the temperature of the cooling plate detected by the temperature measuring unit reaches a peak, reading the first set temperature from the first set temperature storage when the cooling plate reaches the lower limit temperature, and switching control of the cooling device to bring the cooling plate to the target temperature.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

FIG. 26 is a time chart illustrating the operation in the sixth embodiment.

DETAILED DESCRIPTION OF THE PREFERRED EMBODIMENTS

Preferred embodiments of the present invention will be described in detail hereinafter with reference to the drawings.

Figure 1:
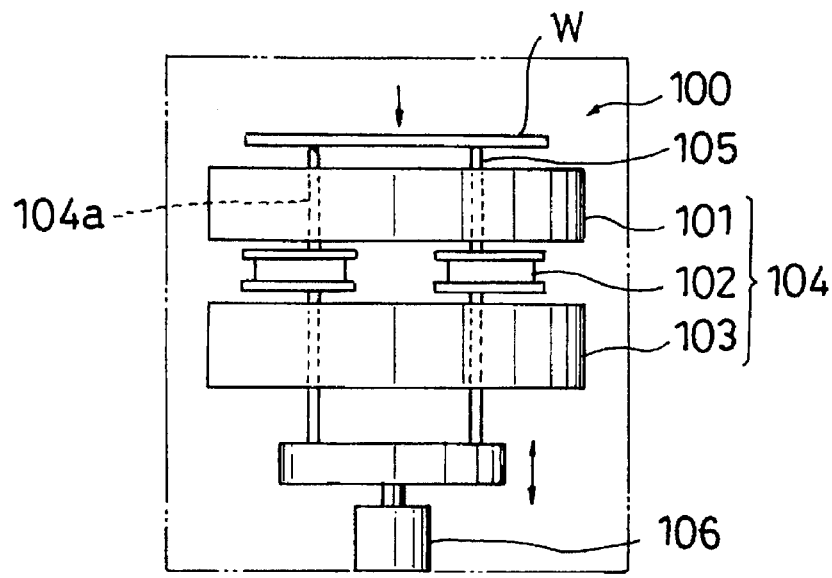
FIG. 1 is a schematic sectional view of a conventional substrate cooling apparatus.
Figure 2:
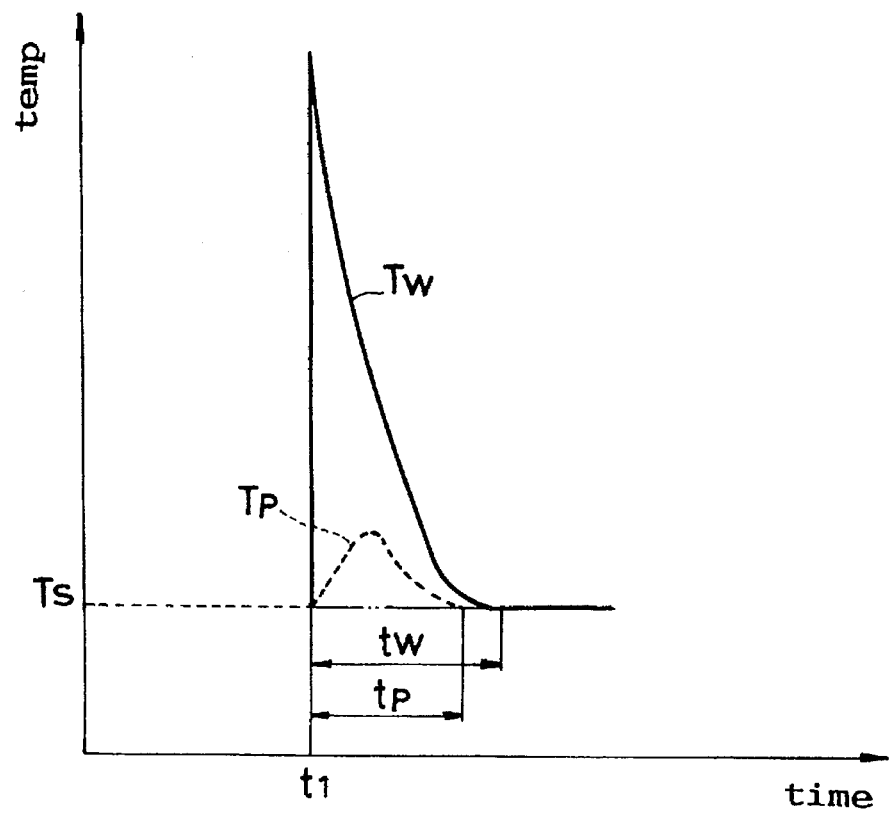
FIG. 2 is a time chart illustrating an operation of the conventional apparatus and its drawback.
Figure 3:
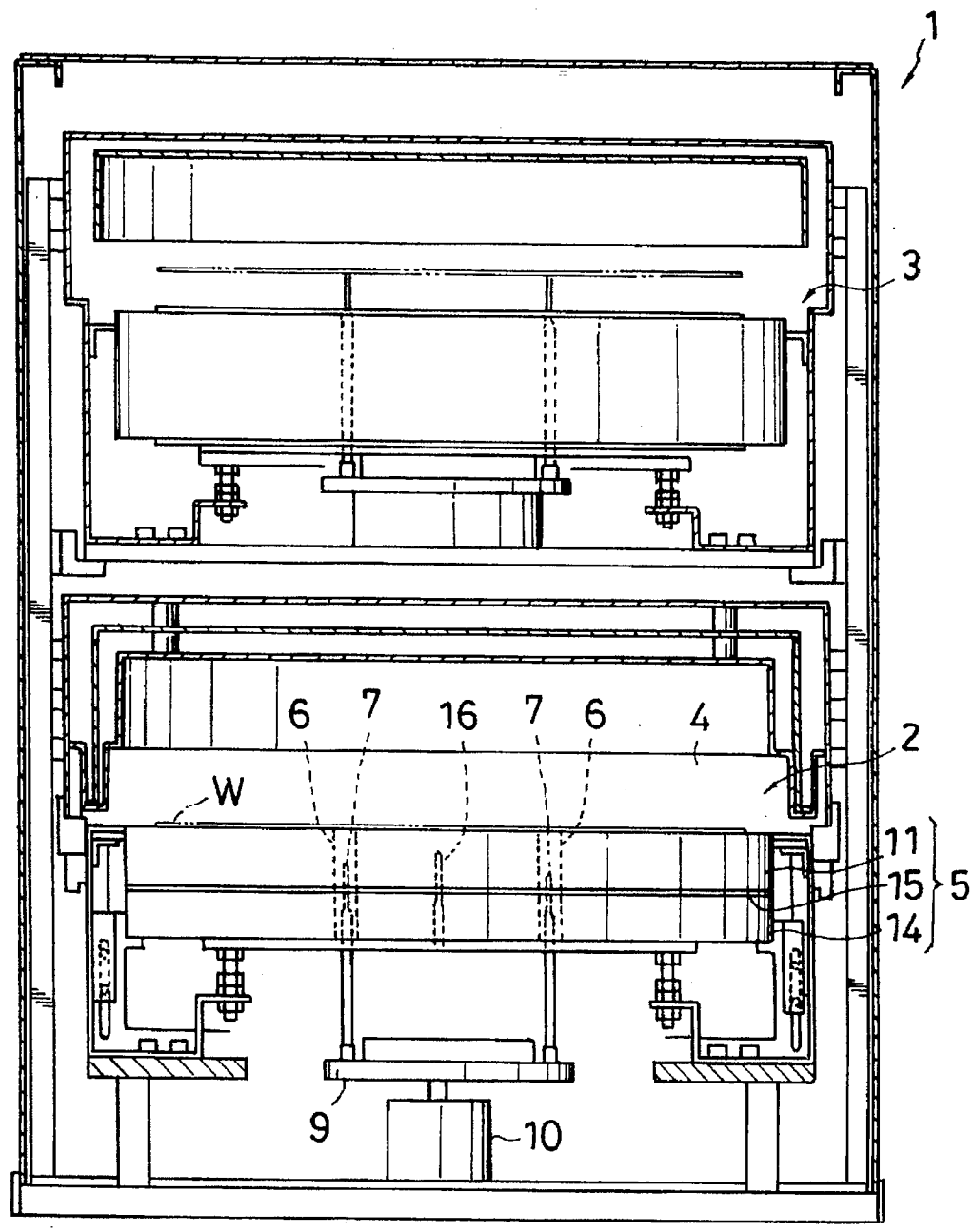
FIG. 3 is an overall view in vertical section of a substrate cooling apparatus according to the present invention.
Figure 4:
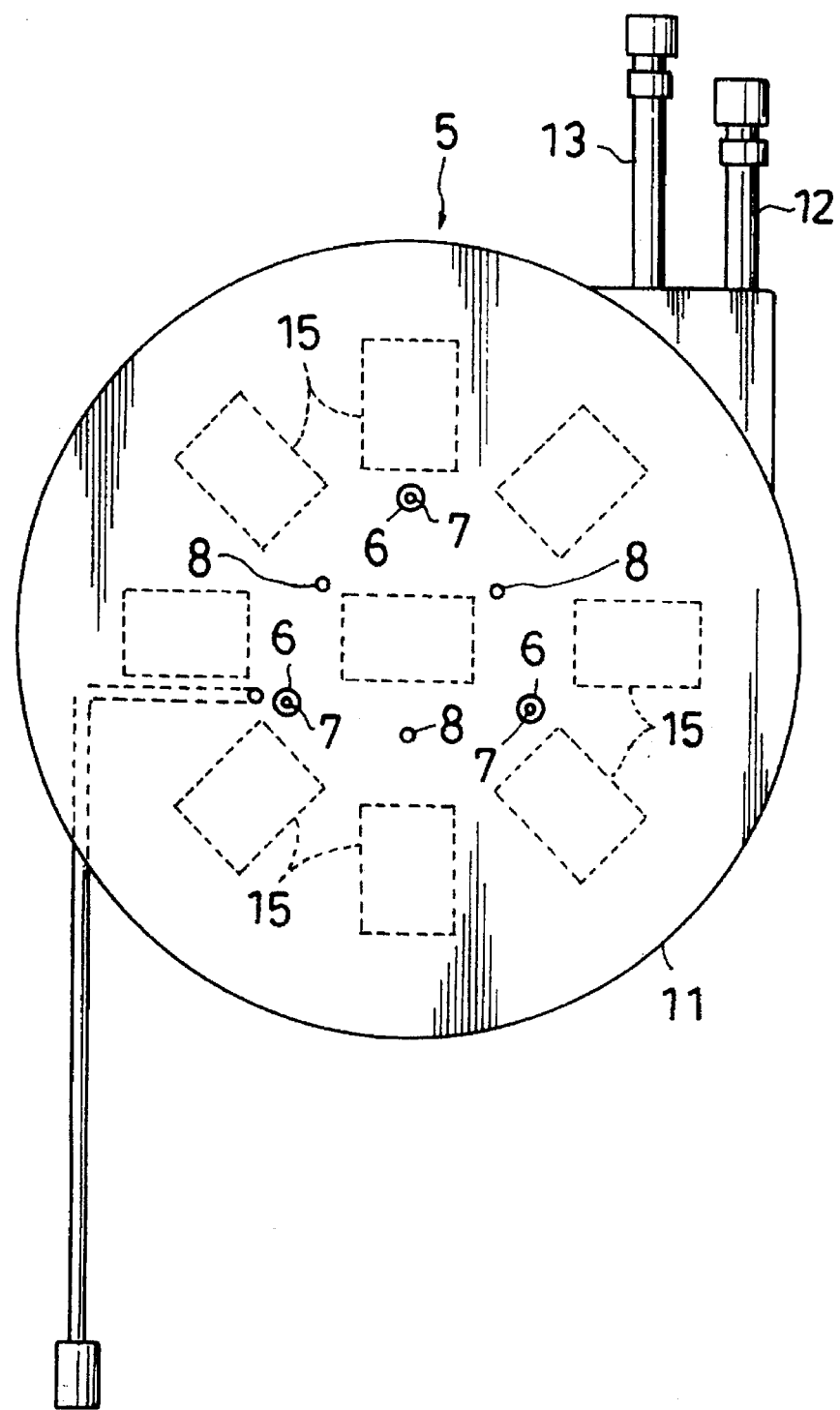
FIG. 4 is a plan view of a principal portion of the substrate cooling apparatus shown in FIG. 3.

FIG. 3 is an overall view in vertical section of a substrate cooling apparatus. FIG. 4 is a plan view of a principal portion thereof. The embodiments described hereinafter represent the present invention applied to the substrate cooling apparatus shown in FIGS. 3 and 4. However, the invention is of course applicable to a substrate cooling apparatus of varied construction.

Referring to FIGS. 3 and 4, a housing 1 includes a substrate cooling apparatus 2 mounted in a lower portion thereof, and a substrate heating apparatus 3 mounted in an upper portion.

The substrate cooling apparatus 2 includes a treating chamber 4 with a cooling plate assembly 5 mounted therein. The plate assembly 5 defines perforations 6 for vertically movably receiving substrate or wafer support pins 7. Further, as shown in FIG. 4, a plurality of proximity balls 8 are arranged on the plate assembly 5 to form a predetermined gap (i.e. a proximity gap) between a substrate or wafer W and the surface of the plate assembly 5. This gap is formed to enhance a uniform cooling effect.

The wafer support pins 7 are rigidly connected to a support member 9 operatively connected to an air cylinder 10 extendible and contractible to raise and lower the support pins 7. When the support pins 7 are raised, the wafer W is placed on or removed from the support pins 7 by a wafer transport robot (not shown). The wafer W is moved to a position resting on the proximity balls 8 on the cooling plate assembly 5 by lowering the support pins 7. The proximity balls 8 are dispensable, so that the wafer W be placed in direct contact with the plate assembly 5.

The cooling plate assembly 5 includes an aluminum heat conduction plate 11 for supporting the wafer W, an aluminum water-cooled radiating plate 14 to which a water supply pipe 12 and a water drain pipe 13 are connected, and quick-cooling Peltier elements 15 interposed between the heat conduction plate 11 and radiating plate 14. The radiating plate 14 is provided for radiating heat of the Peltier elements 15. The heat conduction plate 11 has a plate temperature sensor 19 mounted in a central region thereof for measuring the temperature Tp of the cooling plate assembly 5 cooled by the Peltier elements 15.

The embodiments of the present invention as applied to the above substrate cooling apparatus will be described hereinafter with reference to the drawings.

First Embodiment

A control system in the first embodiment will be described with reference to the block diagram shown in FIG. 5.

Figure 5:
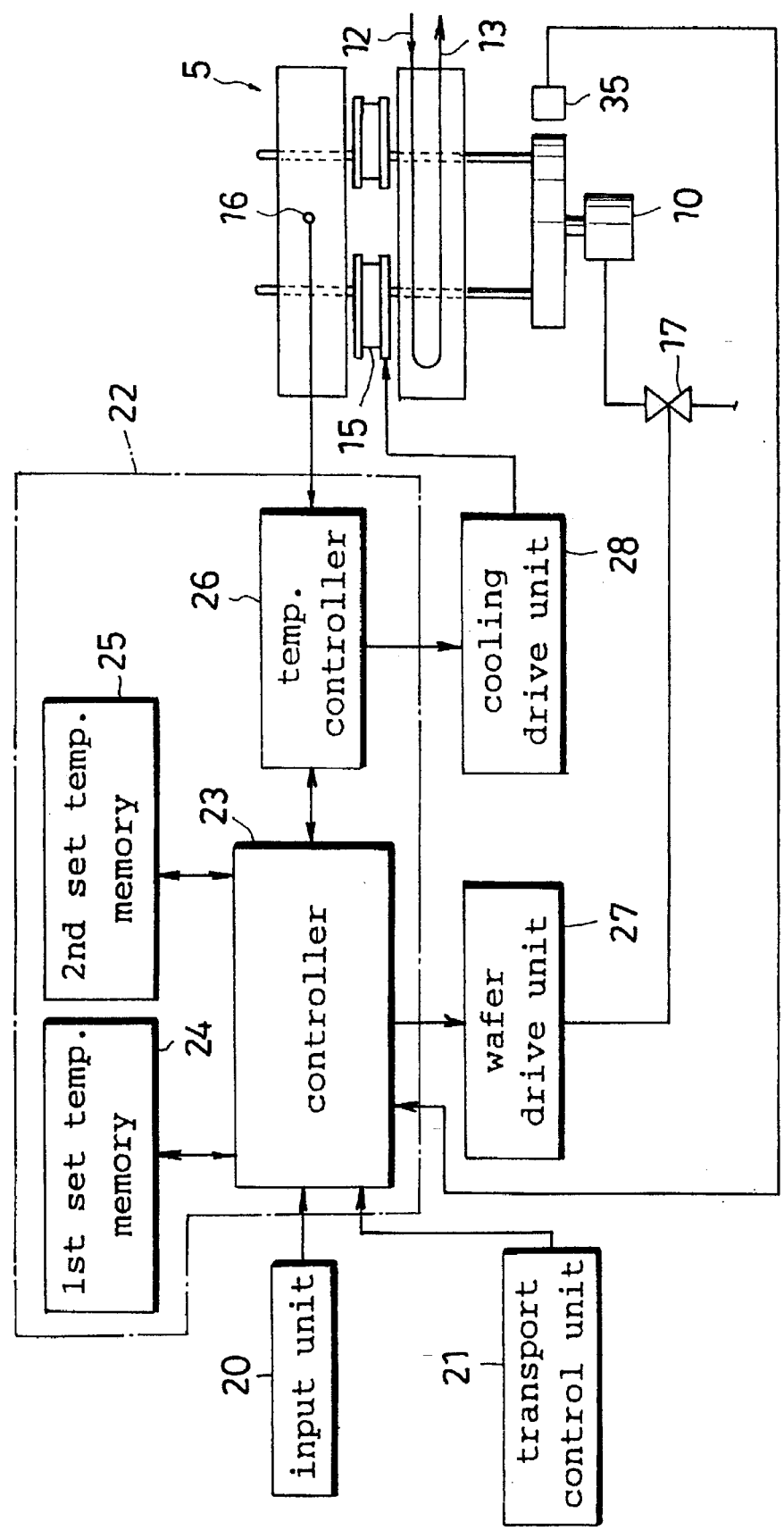
FIG. 5 is a block diagram of a control system in a first to a fourth embodiments of the present invention.

As shown in FIG. 5, the plate temperature sensor 16 is connected to a control unit 22, along with an input unit 20 for inputting various set values described hereinafter, and a transport control unit 21 for outputting a wafer delivery signal. Also connected to the control unit 22 are a wafer drive unit 27 for driving the air cylinder 10 through an electromagnetic valve 17 or the like, and a cooling drive unit 28 for driving the Peltier elements 15.

The input unit 20 comprises a keyboard or the like for use by the operator to input necessary set values such as a set temperature for the cooling plate assembly 5. The set values inputted are transmitted to the control unit 22. These set values will be described hereinafter.

The transport control unit 21, for example, controls timing for the wafer W brought in by the wafer transport robot to be placed on the wafer support pins 7 raised above the cooling plate assembly 5. With this timing, the transport control unit 21 regards the wafer W as having been placed on the wafer support pins 7, and outputs the wafer delivery signal to the control unit 22. A placement sensor 35 is disposed adjacent the wafer support pins 7 for optically detecting whether the support pins 7 are in a raised position or a lowered position, and outputting a wafer placement signal to a controller 23 when the support pins 7 have moved from the raised position to the lowered position.

The control unit 22 includes, besides the controller 23, a first set temperature memory 24 acting as the first set temperature storage for storing a first set temperature $Ts_1$, a second set temperature memory 25 acting as the second set temperature storage for storing a second set temperature $Ts_2$, and a temperature controller 26 for controlling temperature Tp of cooling plate assembly 5.

The controller 23 comprises a microcomputer for storing the first set temperature $Ts_1$ and second set temperature $Ts_2$ received from the input unit 20 in the respective memories 24 and 25, and reading the first set temperature $Ts_1$ or second set temperature $Ts_2$ from the memory 24 or 25 to be outputted to the temperature controller 26 described hereinafter, as a target temperature for the PID control of Peltier elements 15. Which of the first set temperature $Ts_1$ and second set temperature $Ts_2$ should be outputted to the temperature controller 26 is determined based on a control described hereinafter. The controller 23 has further functions to output a pin raising command and a pin lowering command to the wafer drive unit 27 in response to the wafer delivery signal and the like from the transport control unit 21.

The temperature controller 26 also comprises a microcomputer. The temperature controller 26 stores a known program for performing the PID control, and controls Peltier elements 15 to a predetermined target temperature by referring to temperature Tp of the cooling plate assembly 5 measured by the plate temperature sensor 16 and outputting a control signal to the cooling drive unit 28. The target temperature to which this temperature controller 26 controls the Peltier elements 5 under PID control is the set temperature outputted from the controller 23. When, for example, the first set temperature $Ts_1$ is outputted from the controller 23, the PID control is executed to bring the Peltier elements 15 to the first set temperature $Ts_1$. The temperature Tp of the cooling plate assembly 5 detected by the plate temperature sensor 16 is communicated also to the controller 23 through the temperature controller 26.

Figure 6:
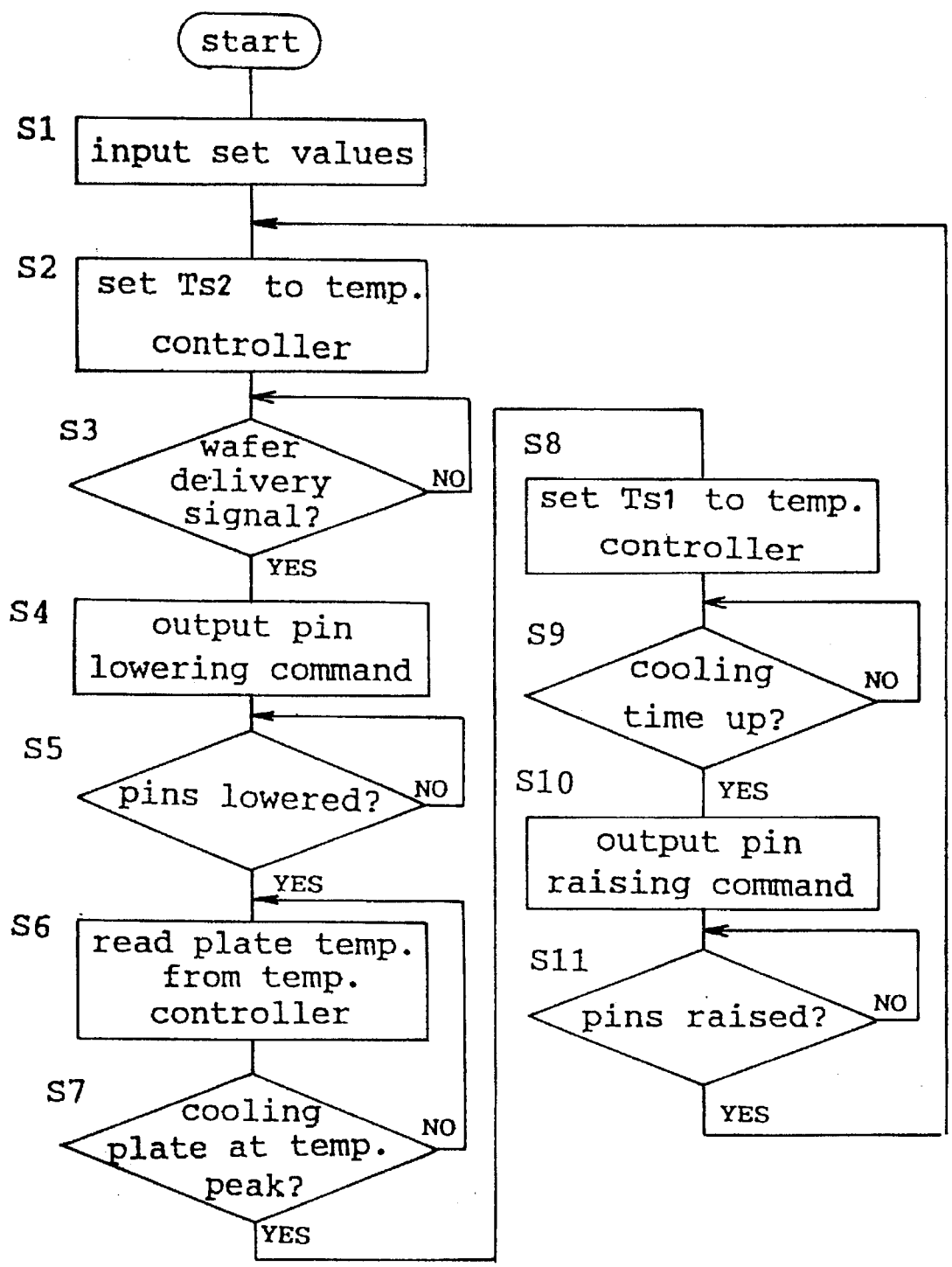
FIG. 6 is a flowchart of a control operation in the first embodiment.
Figure 7A:
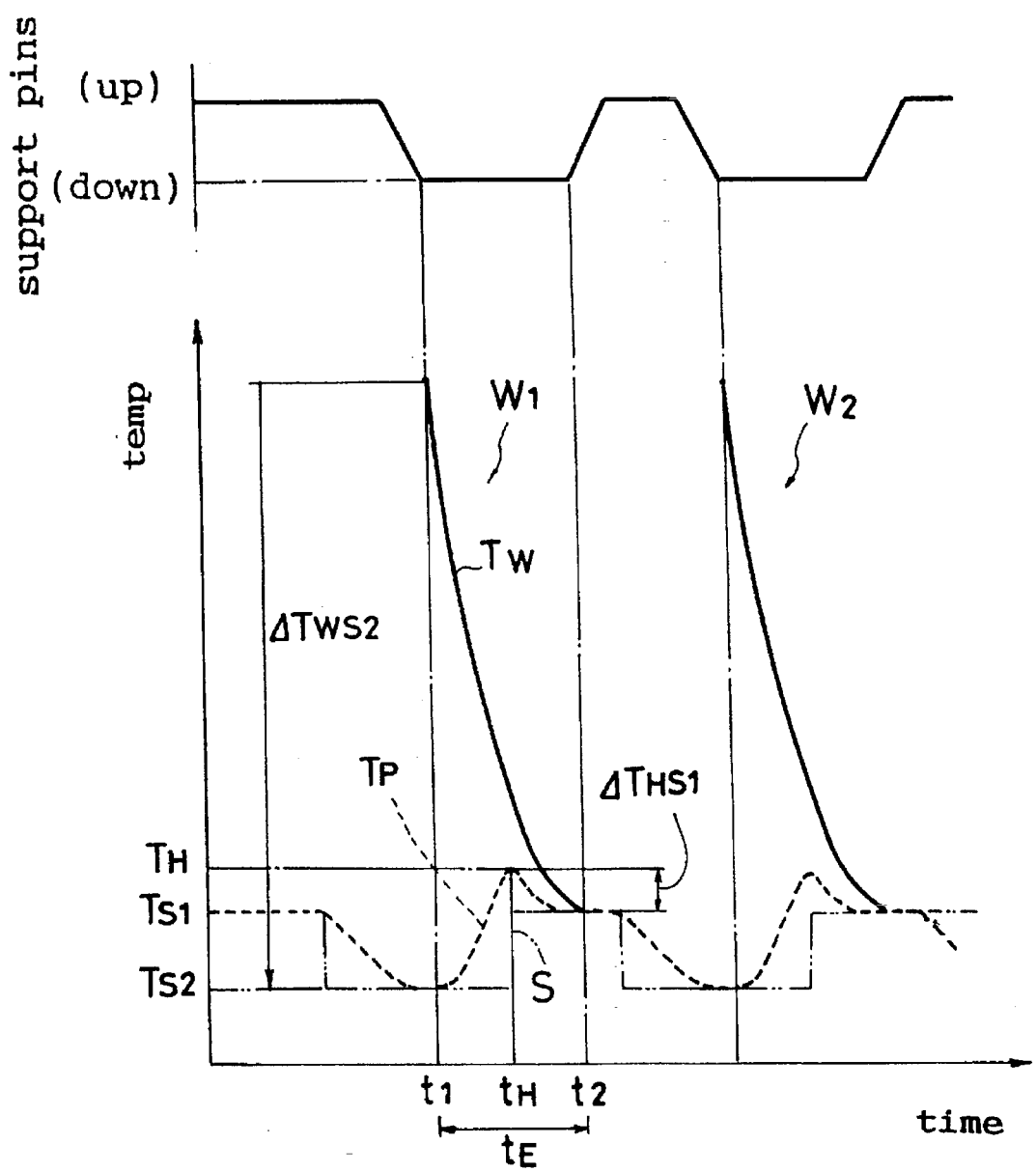
FIG. 7A is a time chart illustrating the operation in the first embodiment.
Figure 7B:
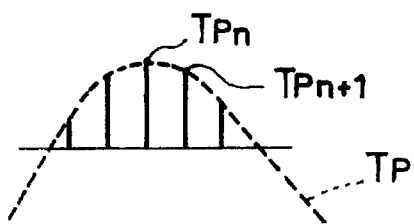
FIG. 7B is an view illustrating a method of detecting a peak of temperature increase.

Next, cooling controls of the above system (substrate cooling method) will be described with reference to the flow chart of FIG. 6 and the time charts of FIGS. 7A and 7B illustrating the operation of controller 23. FIG. 7A shows transport timing of wafers W based on vertical movement of the wafer support pins 7 and temperature changes of wafers W and cooling plate assembly 5. FIG. 7B is a view showing a manner in which a peak of temperature increase $T_H$ is detected. In FIGS. 7A and 7B, wafer temperature Tw is shown in solid lines, plate temperature Tp in broken lines, and temperature S set as the target temperature of Peltier elements 15 in two-dot-and-dash lines.

Step 1: The set values are first inputted through the input unit 20. These set values include the first set temperature $Ts_1$ which is the target temperature to which wafer W1 is to be cooled, the second set temperature $Ts_2$ which is lower than the target temperature, and wafer cooling time $t_E$ from cooling starting time t1 to cooling finishing time t2. These values are empirically determined beforehand according to the type of wafer W1, the capacity of Peltier elements 15, and the like.

The controller 23 stores the first set temperature $Ts_1$ in the first set temperature memory 24, and the second set temperature $Ts_2$ in the second set temperature memory 25. The first set temperature $Ts_1$ is 20° C., for example, which is the target temperature to which wafer W1 is to be cooled. The second set temperature $Ts_2$ is 18° C., for example, which is lower than the first set temperature $Ts_1$. The wafer cooling time $t_E$ is stored in an internal memory of controller 23.

Step 2: Then, the controller 23 outputs the second set temperature $Ts_2$ to the temperature controller 26 before wafer W1 is placed on the cooling plate assembly 5, i.e. before cooling starting time t1. As a result, the second set temperature $Ts_2$ is established in the temperature controller 26 as target temperature S for the PID control of Peltier elements 15. Then, as shown in FIG. 7A, the temperature controller 26 drives Peltier elements 15 under PID control so that temperature Tp of the cooling plate assembly 5 becomes the second set temperature $Ts_2$. As a result, by the time wafer W1 is placed on the cooling plate assembly 5, plate temperature Tp has been maintained below the target temperature, i.e. the first set temperature $Ts_1$, to which wafer W1 is to be cooled.

Steps 3, 4 and 5: Next, the controller 23 checks whether a wafer delivery signal has been outputted from the transport control unit 21, that is whether wafer W1 has been placed on the wafer support pins 7 or not. When wafer W1 has been placed on the wafer support pins 7, the controller 23 outputs a pin lowering command for causing the wafer drive unit 27 to contract the air cylinder 10. Consequently, the wafer support pins 7 are lowered to place wafer W1 on the proximity balls 8 on the cooling plate assembly 5. Thus, wafer W1 is placed above and adjacent the plate assembly 5. A cooling operation for wafer W1 is started then (at point of time t1). The controller 23 determines from the wafer placement signal received from the placement sensor 35 whether lowering of the support pins 7 is completed. The operation moves to step 6 if the pins 7 have been lowered.

Steps 6 and 7: The controller 23 successively reads, through the temperature controller 26, temperature Tp of the cooling plate assembly 5 detected by the plate temperature sensor 16. As shown in FIG. 7B, plate temperature Tp is read every fixed time. A previous plate temperature Tpn and a current plate temperature Tpn+1 are compared to determine whether plate temperature Tp has reached temperature peak $T_H$. That is, the controller 23 determines that temperature peak $T_H$ has been reached if the current temperature Tpn+1 is lower than the previous temperature Tpn.

Steps 8 and 9: When plate temperature Tp reaches temperature peak $T_H$, the controller 23 reads the first set temperature $Ts_1$ from the first set temperature memory 24, and outputs the first set temperature $Ts_1$ to the temperature controller 26 (at point of time tH). Thus, the first set temperature $Ts_1$ is established in the temperature controller 26 as target temperature S for the PID control of Peltier elements 15. That is, as shown in FIG. 7A, the target temperature for the PID control of the Peltier elements is switched at peak time tH of plate temperature Tp from the second set temperature $Ts_2$ to the first set temperature $Ts_1$. Then, the temperature controller 26 drives Peltier elements 15 under PID control so that plate temperature Tp becomes the first set temperature $Ts_1$.

Functions of the first embodiment will now be described with reference to the time chart of FIG. 7A.

When wafer W1 to be cooled is placed on the cooling plate assembly 5 at cooling starting time t1, wafer temperature Tw is high (e.g. 100° C. or above). As shown in FIG. 7A, wafer temperature Tw is absorbed by the cooling plate assembly 5 and begins to fall rapidly. The quantity of heat transfer, due to the absorption, from wafer W1 to cooling plate assembly 5 is greater at this time than the quantity of heat transfer from cooling plate assembly 5 to Peltier elements 15 resulting from the cooling action of the latter. As a result, plate temperature Tp is temporarily raised by temperature Tw of wafer W1. At this time, the second set temperature $Ts_2$ lower than the first set temperature $Ts_1$ or target temperature for cooling wafer W1 has been established as target temperature S for the PID control of Peltier elements 15, i.e. as the target temperature to which the plate assembly 5 is cooled. Thus, a relatively large temperature difference $\Delta Tws_2$ occurs between wafer temperature Tw and plate temperature Tp immediately after wafer W1 is placed on the cooling plate assembly 5. Wafer temperature Tw is therefore lowered quickly toward the second set temperature $Ts_2$. On the other hand, Peltier elements 15 are driven relatively forcefully to become the second set temperature $Ts_2$, thereby restraining the increase of plate temperature Tp under the influence of temperature Tw of wafer W1. Consequently, plate temperature Tp returns to the lower level quickly, with the result that wafer temperature Tw is lowered quickly too.

Once plate temperature Tp reaches temperature peak $T_H$, wafer temperature Tw is lowered with high precision without becoming below the first set temperature $Ts_1$ since plate temperature Tp is set to the first set temperature $Ts_1$. With the increase of plate temperature Tp being restrained, only a small temperature difference $\Delta THs_1$ occurs between temperature peak $T_H$ and the first set temperature $Ts_1$. Consequently, plate temperature Tp reaches the first set temperature $Ts_1$ relatively quickly, which in turn causes wafer temperature Tw to reach the first set temperature $Ts_1$ quickly. Thus, wafer W1 is cooled to the target temperature precisely and quickly. This feature provides the advantage that, in a subsequent process of applying a photoresist solution to the semiconductor wafer, for example, no adverse influence is exerted on film thickness distribution.

Steps 9 through 11: Next, the controller 23 checks whether the predetermined wafer cooling time $t_E$ is up. If cooling time $t_E$ is up, at cooling finishing time t2. the controller 23 gives a pin raising command to the wafer drive unit 27 for extending the air cylinder 10 to raise the wafer support pins 7. Consequently, wafer W1 is raised above the cooling plate assembly 5 to complete the cooling treatment. Then, the operation returns to step 2, and the controller 23 outputs the second set temperature $Ts_2$ to the temperature controller 26. As a result, the second set temperature $Ts_2$ is established in the temperature controller 26 as target temperature S for the PID control of Peltier elements 15. Then, the temperature controller 26 drives Peltier elements 15 under PID control so that temperature Tp of the cooling plate assembly 5 returns to the second set temperature $Ts_2$ prior to commencement of a cooling operation for next wafer W2. By repeating the foregoing operations, a plurality of wafers W are cooled to the first set temperature $Ts_1$ which is room temperature, e.g. 20° C. Wafers W cooled are transferred to a next process.

According to the above operations, wafers W are cooled quickly, and besides the time required for transport of wafers W into and out of the apparatus is utilized to lower the plate temperature Tp to the second set temperature $Ts_2$ below the first set temperature $Ts_1$ which is the target temperature to which wafers W are to be cooled. Thus, a plurality of wafers W are cooled efficiently. This provides an improved throughput of the substrate cooling apparatus 2, and hence an improved throughput of the entire wafer cooling treatment.

In the first embodiment, the temperature peak of cooling plate assembly 5 as detected by the plate temperature sensor 16 is determined at step 7 in the control program stored in the controller 23 comprising a microcomputer. However, this is not limitative. For example, a separate peak detection electronic circuit may be provided, which inputs detection results to the controller 23. This modification is applicable also to the fourth, fifth and sixth embodiments described hereinafter.

Second Embodiment

Figure 8:
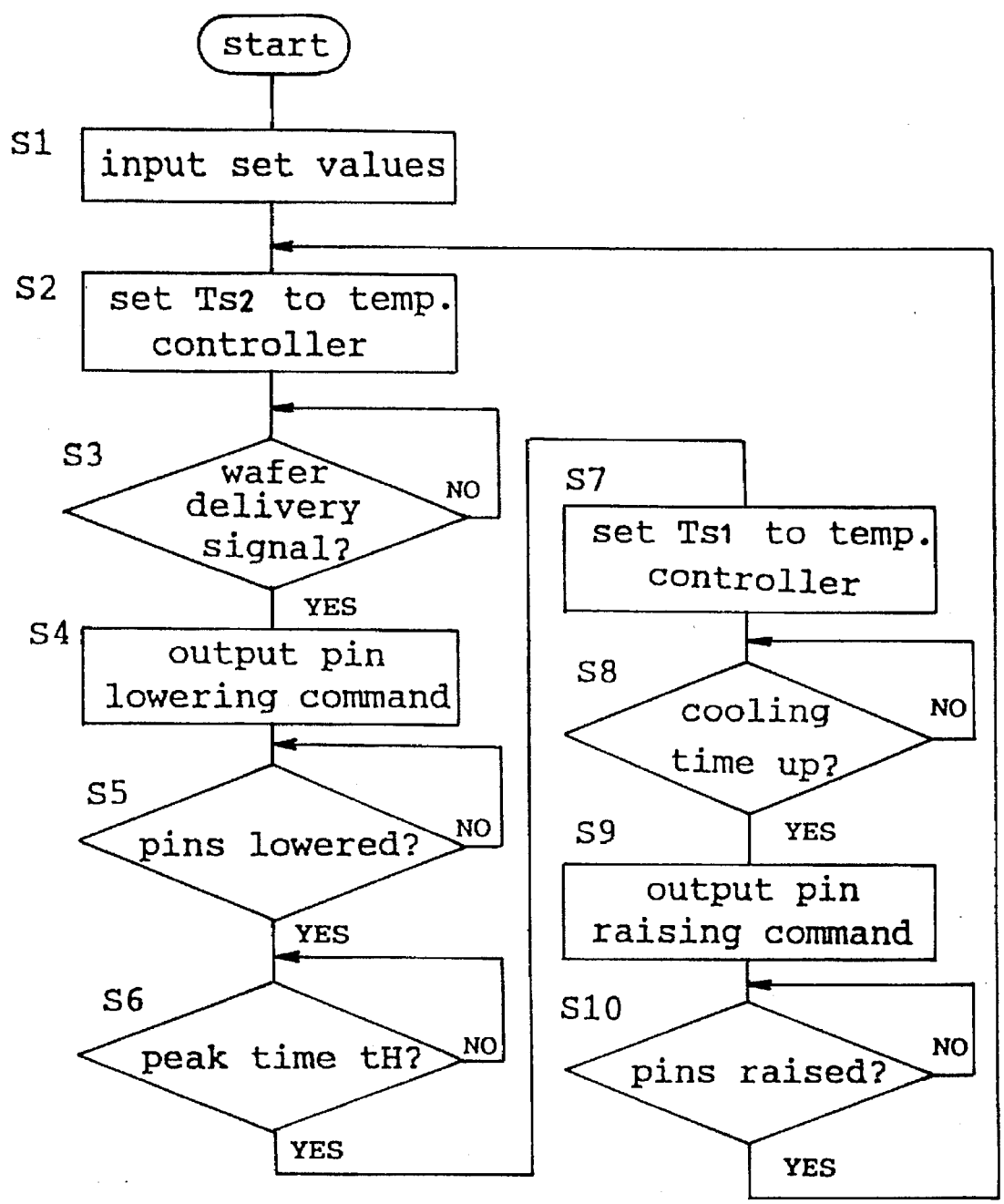
FIG. 8 is a flowchart of a control operation in the second embodiment.

The substrate cooling apparatus in the second embodiment has the same mechanical construction as the apparatus in the first embodiment (FIGS. 3 through 5). This embodiment has cooling controls (substrate cooling method) different from those of the first embodiment, which will be described with reference to the flow chart of FIG. 8 and the time chart of FIG. 9.

Step 1: The set values are first inputted through the input unit 20. These set values include the first set temperature $Ts_1$, the second set temperature $Ts_2$, wafer cooling time $t_E$, and time tS from cooling starting time t1 to temperature peak $T_H$ of the cooling plate assembly 5. Time tS is empirically determined beforehand according to the type of wafer W1, the capacity of Peltier elements 15, and the like. For example, time tS is determined and inputted in advance by using the method of determining temperature peak $T_H$ as at steps 6 and 7 in the first embodiment. The first set temperature $Ts_1$ inputted is stored in the first set temperature memory 24, and the second set temperature $Ts_2$ in the second set temperature memory 25. The wafer cooling time $t_E$ and time tS are stored in the internal memory of controller 23.

Figure 9:
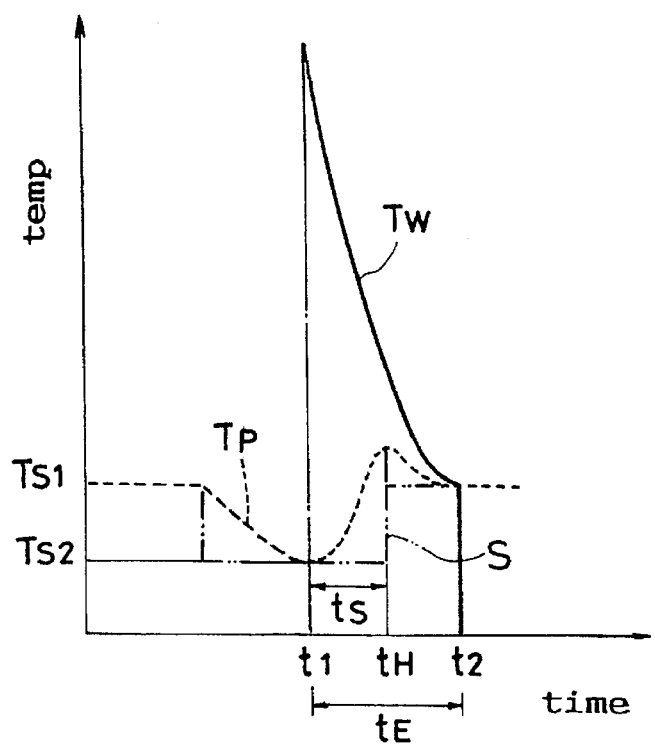
FIG. 9 is a time chart illustrating the operation in the second embodiment.

Steps 2 through 5: As at steps 2 through 5 in the first embodiment, the second set temperature $Ts_2$ is selected as target temperature S for the PID control of Peltier elements 15 of the cooling plate assembly 5. With the plate assembly 5 controlled to be at the second set temperature $Ts_2$, the wafer W is placed on the plate assembly 5 and a cooling operation is started. After cooling starting time t1, as shown in FIG. 9, wafer temperature Tw is lowered quickly toward the second set temperature $Ts_2$.

Steps 6 and 7: The controller 23 determines, based on its internal clock, whether predetermined time tS from cooling starting time t1 has elapsed or not. Upon lapse of time tS, or at peak time tH, the controller 23 reads the first set temperature $Ts_1$ from the first set temperature memory 24, and outputs the first set temperature $Ts_1$ to the temperature controller 26. Thus, the first set temperature $Ts_1$ is established in the temperature controller 26 as target temperature S for the PID control of Peltier elements 15. That is, the target temperature for the PID control of the Peltier elements is switched from the second set temperature $Ts_2$ to the first set temperature $Ts_1$. Then, the temperature controller 26 drives Peltier elements 15 under PID control so that temperature Tp of the cooling plate assembly 5 becomes the first set temperature $Ts_1$. As a result, wafer temperature Tw is lowered with high precision without becoming below the first set temperature $Ts_1$.

Steps 8 through 10: As at steps 9 through 11 in the first embodiment, when cooling time $t_E$ is up, wafer W is raised above the cooling plate assembly 5 to complete the cooling treatment. Then, the operation returns to step 2 to return temperature Tp of the cooling plate assembly 5 to the second set temperature $Ts_2$ prior to commencement of a cooling operation for next wafer W2. By repeating the foregoing operations, wafers W are cooled to the first set temperature $Ts_1$ which is room temperature, e.g. 20° C. Wafers W cooled are transferred to a next process.

Thus, in the second embodiment, as in the first embodiment, wafers W are cooled quickly. In the second embodiment in particular, after lapse of predetermined time tS from placement of wafer W on the cooling plate assembly 5, target temperature S for the PID control of Peltier elements 15 is switched from the second set temperature $Ts_2$ to the first set temperature $Ts_1$. Consequently, temperatures Tw of wafers W invariably describe the same cooling line to reach the target temperature. This feature is advantageous in successively treating a plurality of wafers W of the same type, e.g. wafers W at the same initial temperature prior to cooling, of the same size or having contact surfaces processed in the same way. In addition, the cooling treatment is effected with a high degree of uniformity among the wafers. In this embodiment, after lapse of predetermined time tS, target temperature S for the PID control of Peltier elements 15 is switched to the first set temperature $Ts_1$ as noted above. Once predetermined time tS is fixed empirically, plate temperature Tp need not be controlled in actual treatment. Thus, wafers W may be cooled quickly in a simple cotrol mode.

In the second embodiment, predetermined time tS is selected to effect switching from the second set temperature $Ts_2$ to the first set temperature $Ts_1$ at a point of time when the temperature of cooling plate assembly 5 reaches its peak. This feature is not limitative. For example, predetermined time tS may be selected to effect switching from the second set temperature $Ts_2$ to the first set temperature $Ts_1$ with a slight delay from the point of time when the temperature of cooling plate assembly 5 reaches its peak. This modification may expedite the cooling treatment since the control operation continues for an extended time with the target temperature set below the first set temperature $Ts_1$.

In the second embodiment, lapse of the predetermined time from placement of wafer W on the cooling plate assembly 5 is measured at step 6 by counting the internal clock of the controller 23 comprising a microcomputer. However, this is not limitative. For example, a separate timer circuit may be provided, which inputs measurement results to the controller 23.

Third Embodiment

Figure 11:
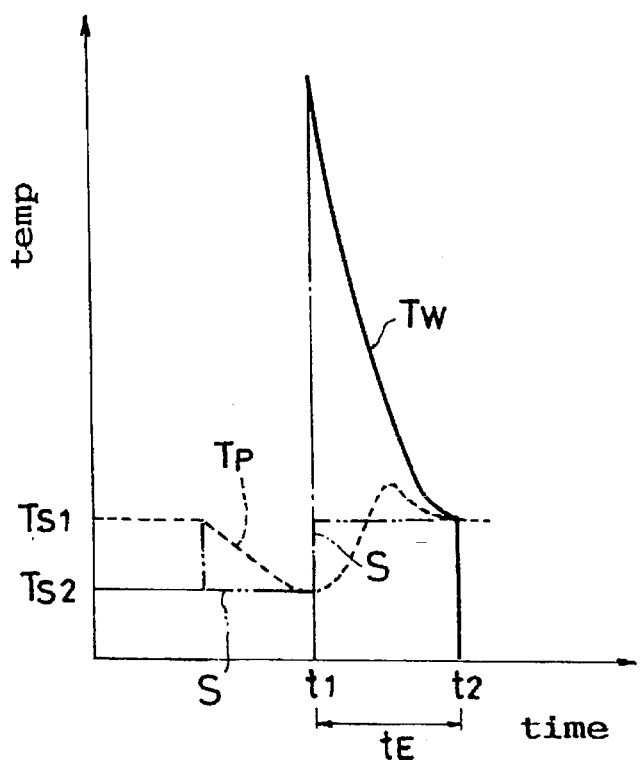
FIG. 11 is a time chart illustrating the operation in the third embodiment.
Figure 10:
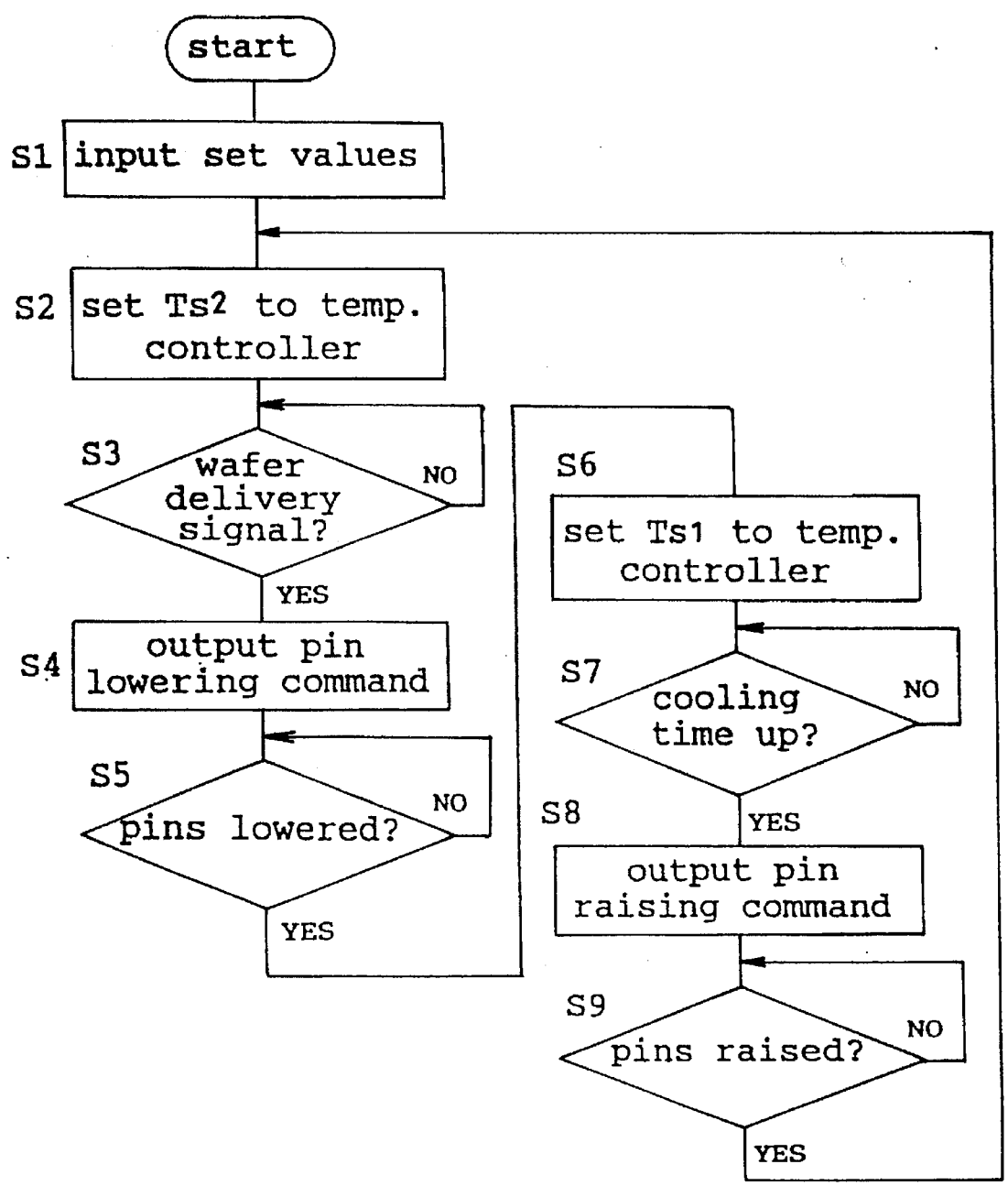
FIG. 10 is a flowchart of a control operation in the third embodiment.

The substrate cooling apparatus in the third embodiment also has the same mechanical construction as the apparatus in the first embodiment (FIGS. 3 through 5). This embodiment has cooling controls (substrate cooling method) different from those of the first embodiment, which will be described with reference to the flow chart of FIG. 10 and the time chart of FIG. 11.

Step 1: The set values are first inputted through the input unit 20. These set values include the first set temperature Ts1, the second set temperature $Ts_2$, and wafer cooling time $t_E$.

Steps 2 through 4: As at steps 2 through 5 in the first embodiment, the second set temperature $Ts_2$ is selected as target temperature S for the PID control of Peltier elements 15 of the cooling plate assembly 5. With the plate assembly 5 controlled to be at the second set temperature $Ts_2$, the wafer W is placed on the plate assembly 5 and a cooling operation is started.

Steps 5 and 6: When wafer W has been placed on the wafer support pins 7, the placement sensor 35 outputs the wafer placement signal to the controller 23. Then, the controller 23 reads the first set temperature $Ts_1$ from the first set temperature memory 24, and outputs the first set temperature $Ts_1$ to the temperature controller 26. Thus, the first set temperature $Ts_1$ is established in the temperature controller 26 as target temperature S for the PID control of Peltier elements 15. That is, the target temperature for the PID control of the Peltier elements is switched to the first set temperature $Ts_1$. Then, the temperature controller 26 drives Peltier elements 15 under PID control so that temperature Tp of cooling plate assembly 5 becomes the first set temperature $Ts_1$.

Steps 7 through 9: As at steps 9 through 11 in the first embodiment, when cooling time $t_E$ is up, wafer W is raised above the cooling plate assembly 5 to complete the cooling treatment. Then, the operation returns to step 2 to return temperature Tp of the cooling plate assembly 5 to the second set temperature $Ts_2$ prior to commencement of a cooling operation for next wafer W2. By repeating the foregoing operations, wafers W are cooled to the first set temperature $Ts_1$ which is room temperature, e.g. 20° C. Wafers W cooled are transferred to a next process.

Thus, in the third embodiment, simultaneously with placement of wafer W on the cooling plate assembly 5, the control of Peltier elements 15 is switched so that temperature Tp of the plate assembly 5 becomes the first set temperature $Ts_1$. This simplifies the control. By the time wafer W is placed in position, the temperature of cooling plate assembly 5 has been lowered below the first set temperature $Ts_1$. Thus, wafer W may be cooled more quickly than in the prior art in which the cooling plate assembly 5 is constantly maintained at the first set temperature $Ts_1$.

Fourth Embodiment

The substrate cooling apparatus in the fourth embodiment differs from that in the first embodiment in the following respect.

Figure 12:
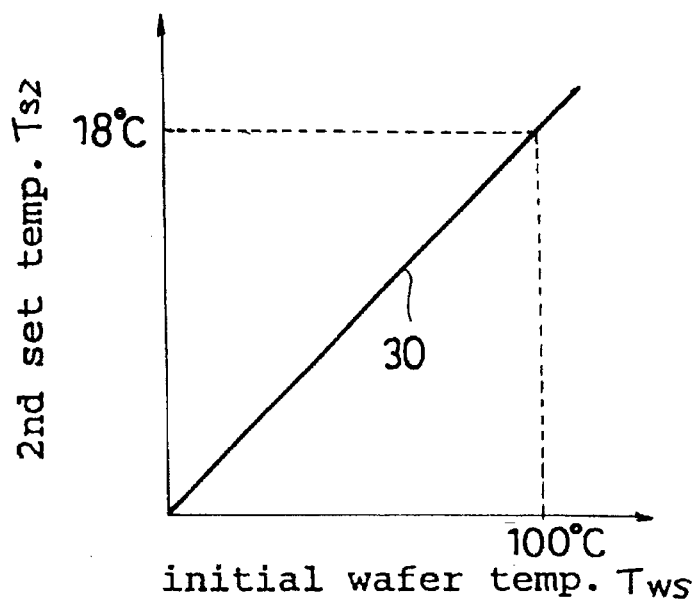
FIG. 12 is a schematic view illustrating a table memory in the fourth embodiment.

The second set temperature memory 25 comprises a table memory 30 having a data makeup as schematically shown in FIG. 12. Specifically, the table memory 30 stores a plurality of values assuming initial temperatures TwS of wafers W before placement on the cooling plate assembly 5, and optimal second set temperatures $Ts_2$ related to these values, respectively. For example, the table memory 30 stores 18° C. as the second set temperature $Ts_2$ related to initial temperature TwS at 100° C., and relatively low 17° C. as the second set temperature $Ts_2$ related to initial temperature TwS at relatively high 120° C. Thus, the data stored in the table memory 30 are numeric values optimal for quickly cooling a relatively hot wafer W and a relatively cold wafer W to the same level. Such data are prepared by empirically determining second set temperatures $Ts_2$ necessary for cooling wafers W to the same level according to initial temperatures TwS thereof. When the initial temperature TwS of wafer W to be cooled is inputted through the input unit 20, the controller 23 reads from the table memory 30 the second set temperature $Ts_2$ related to the initial temperature TwS. When, for example, the initial temperature TwS at 100° C. is inputted from the input unit 20 to the controller 23, the controller 23 reads the value 18° C. as the second set temperature $Ts_2$ related to the initial temperature at 100° C. from among the data stored in the table memory 30. The other aspects of this embodiment are the same as in the first embodiment.

Figure 13:
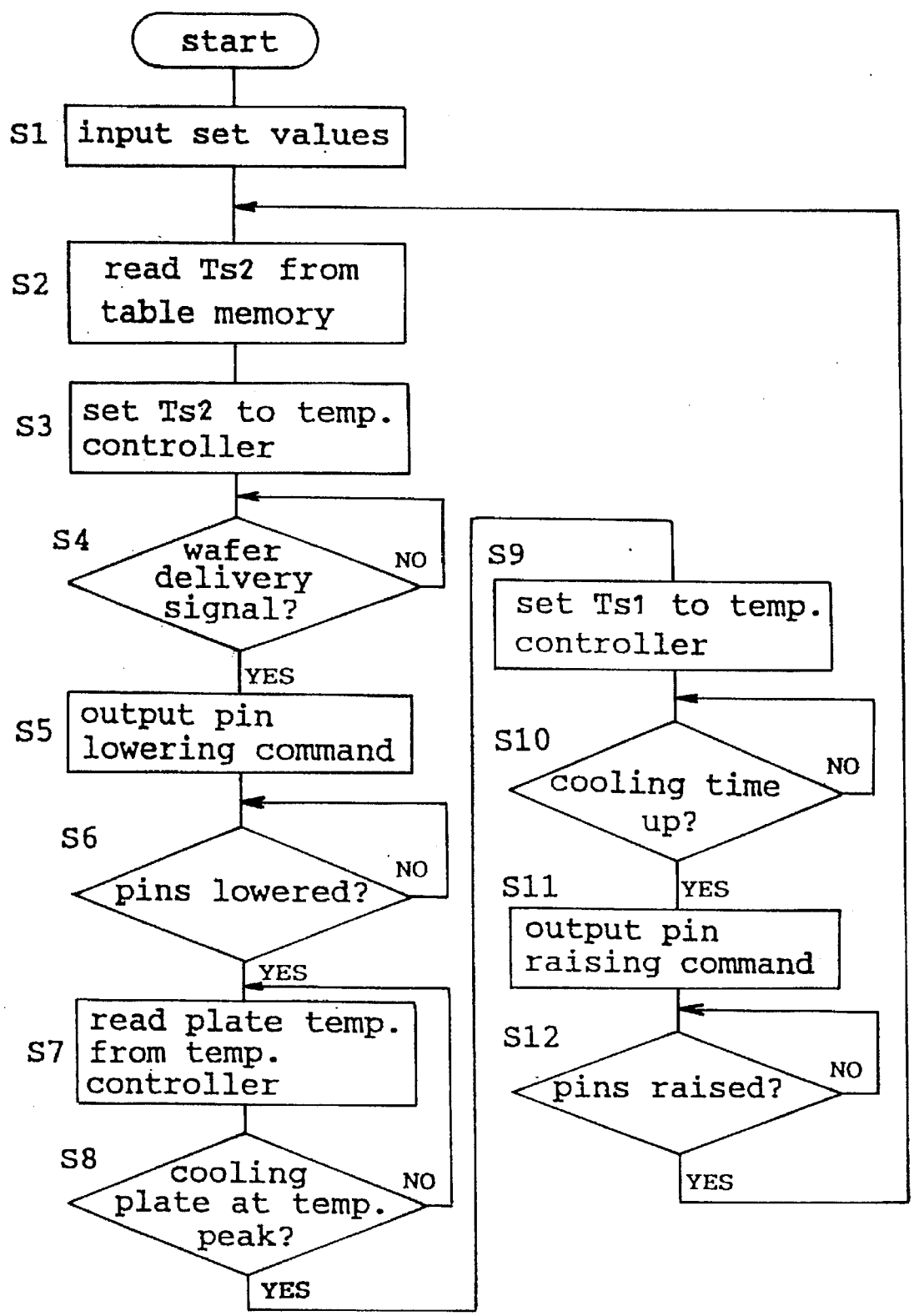
FIG. 13 is a flowchart of a control operation in the fourth embodiment.

Next, cooling controls (substrate cooling method) in the fourth embodiment will be described with reference to the flow chart of FIG. 13 and the time chart of FIG. 14.

Step 1: The set values are first inputted through the input unit 20. These set values include the first set temperature $Ts_1$, wafer cooling time $t_E$, and initial temperature $Tw_S$ of wafer W to be cooled.

Step 2: The controller 23 reads optimal second set temperature $Ts_2$ related to initial temperature $Tw_S$ from the table memory 30.

Steps 3 through 12: As at steps 2 through 11 in the first embodiment, temperature Tp of the cooling plate assembly 5 is set to the second set temperature $Ts_2$, the wafer W is placed on the plate assembly 5, and a cooling operation is started. When the plate temperature Tp reaches its peak $T_H$, Peltier elements 15 are driven under PID control so that plate temperature Tp becomes the first set temperature $Ts_1$. Upon lapse of the wafer cooling time, wafer W is raised above the cooling plate assembly 5 to complete the cooling treatment. Then, the operation returns to step 2 to return temperature Tp of the cooling plate assembly 5 to the second set temperature $Ts_2$ related to the initial temperature Tw of a next wafer W2 to be cooled.

Functions of the fourth embodiment will now be described with reference to the time chart of FIG. 14. In FIG. 14, temperature $Tw_H$ of wafer W having a relatively high initial temperature $Tw_S$ at 120° C. and plate temperature $Tp_H$ therefor are shown in solid lines, and temperature $Tw_L$ of wafer W having a relatively low initial temperature $Tw_S$ at 100° C. and plate temperature $Tp_L$ therefor are shown in broken lines.

Figure 14:
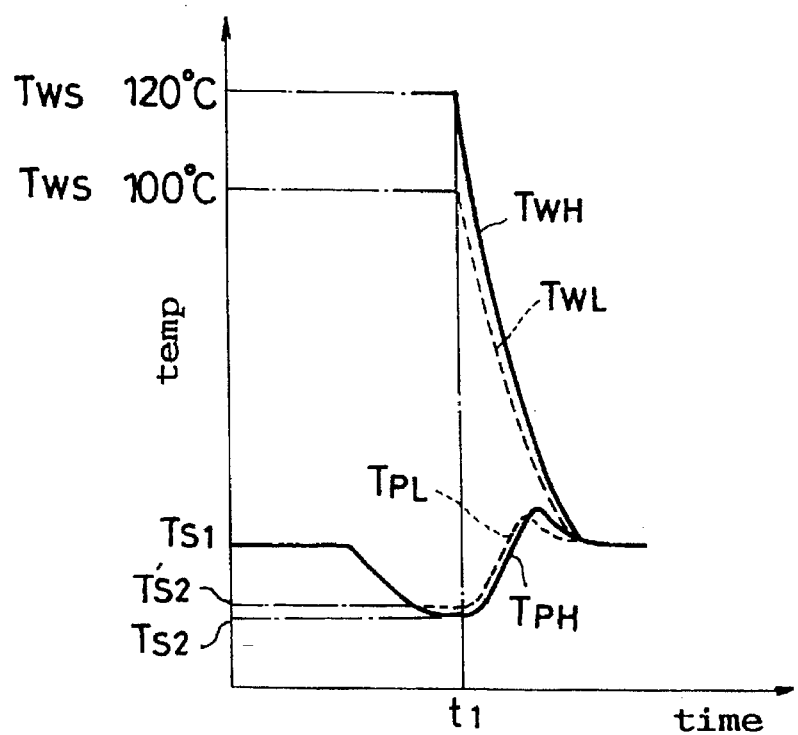
FIG. 14 is a time chart illustrating the operation in the fourth embodiment.

In the case of initial temperature $Tw_S$ at 100° C., as shown in FIG. 14, the second set temperature $T'_{s2}$ which is the target temperature for the PID control of Peltier elements 15 of the cooling plate assembly 5 carried out in the initial cooling stage is set to 18° C. suited for desired quick cooling. As a result, wafer W is cooled quickly as desired. When the initial temperature $Tw_S$ is relatively high at 120° C., the second set temperature $T'_{s2}$ is set to relatively low 17° C. That is, in this case, Peltier elements 15 are driven with a greater force for faster cooling than when initial temperature $Tw_S$ is at 100° C. In this way, second set temperatures $Ts_2$ are selected according to initial temperatures $Tw_S$ of respective wafers W to be cooled. The relatively hot wafer W can be cooled at about the same rate as the relatively cold wafer W. By substantially equalizing the time required for cooling treatment of different wafers, the apparatus is operable with facility.

In the fourth embodiment, the operator inputs initial temperature $Tw_S$ of wafer W to be cooled, through the input unit 20 to the controller 23. Instead, for example, a separate input device such as a radiation thermometer may be provided for detecting, in non-contact mode, the temperature of wafer W supported by the wafer support pins 7, and inputting the measurement to the controller 23.

In the fourth embodiment, switching is made from the second set temperature $Ts_2$ to the first set temperature $Ts_1$ at the point of time when temperature Tp of the cooling plate assembly 5 reaches its peak $T_H$. The present invention is not limited to the above. As in the second embodiment, switching may be made from the second set temperature $Ts_2$ to the first set temperature $Ts_1$ upon lapse of predetermined time tS. Further, as in the third embodiment, switching may be made from the second set temperature $Ts_2$ to the first set temperature $Ts_1$ upon receipt of the wafer placement signal.

In the first to fourth embodiments described hereinbefore, placement of wafer W on the cooling plate assembly 5 is detected by means of the wafer placement signal from the placement sensor 35. Where, for example, the wafer drive unit 27 is operable in response to the wafer delivery signal from the transport control unit 21, placement of wafer W on the cooling plate assembly 5 may be determined based on lapse of a predetermined time (required for the wafer support pins 7 to descend from upper position to lower position) from input to the controller 23 of the wafer delivery signal from the transport control unit 21. This modification is applicable also to the fifth and sixth embodiments described hereinafter.

In the first to fourth embodiments, placement of wafer W on the cooling plate assembly 5 may be determined based on a comparison between the temperature detected by the plate temperature sensor 16 and a predetermined set temperature. That is, the temperature of cooling plate assembly 5 increases by not a few degrees, and placement of wafer W on the cooling plate assembly 5 may be determined based on this temperature increase. This detection mode may also be applied to the fifth and sixth embodiments described hereinafter.

Further, in the first to fourth embodiments, Peltier elements 15 are driven under PID control. The present invention is not limited to PID control, but may employ ON/OFF control. In short, it is in accordance with the present invention to control the cooling plate assembly 5 so that its temperature Tp becomes the first set temperature $Ts_1$ or second set temperature $Ts_2$.

Fifth Embodiment

Figure 15:
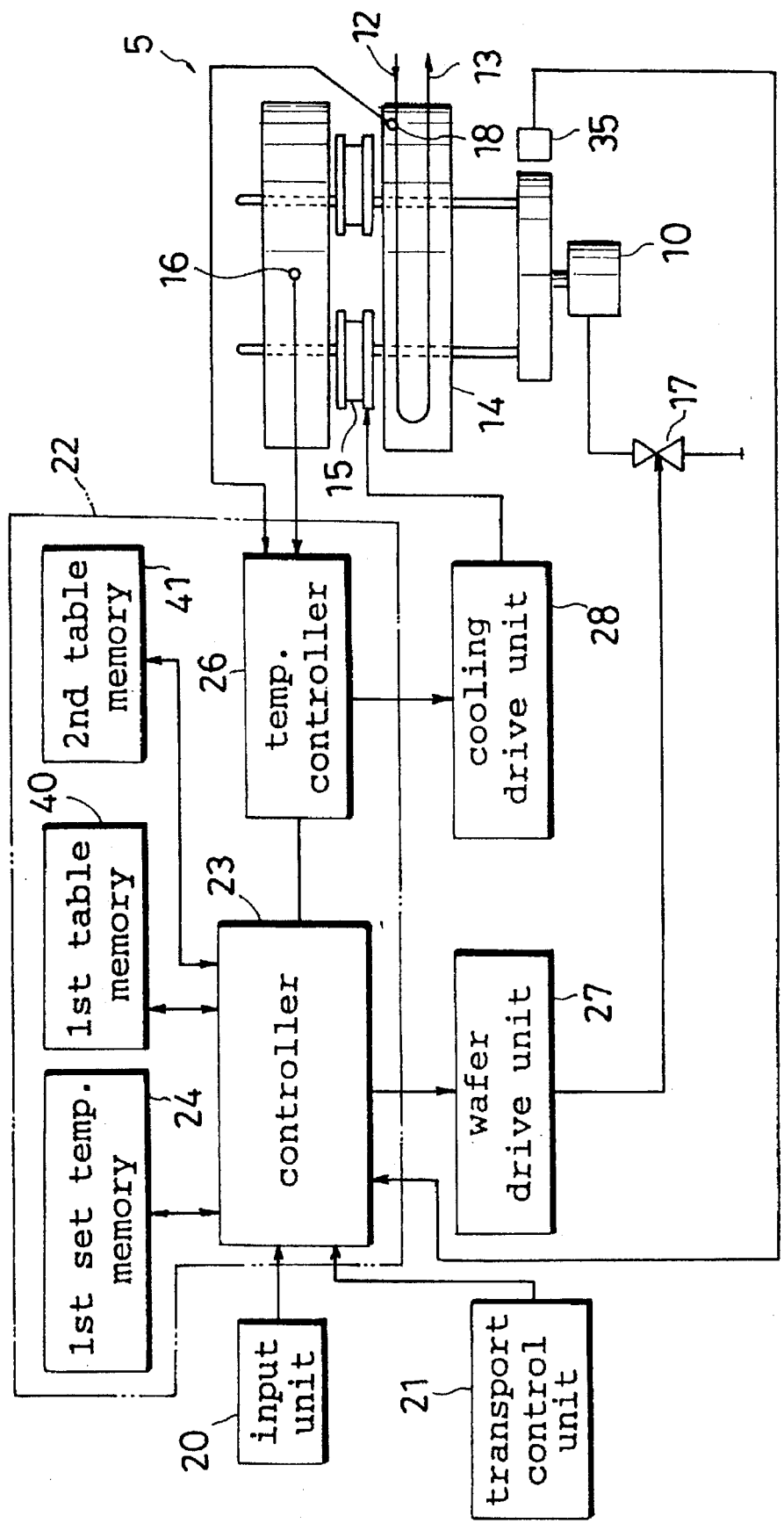
FIG. 15 is a block diagram of a control system in a fifth embodiment of the present invention.

A control system in the fifth embodiment will be described with reference to FIG. 15.

The second set temperature memory 24 in the first embodiment (see FIG. 5) is omitted from the fifth embodiment. Additionally provided in the fifth embodiment are a first table memory 40 acting as the lower limit set temperature storage, a second table memory 41 acting as the duty ratio storage, and a radiating water temperature sensor 18 acting as the radiating water temperature measuring unit.

The radiating water temperature sensor 18 is connected to the water supply pipe 12 of the radiating plate 14 for measuring the temperature of radiating water flowing through the water supply pipe 12. The radiating water temperature is transmitted to the controller 23 through the temperature controller 26.

The first table memory 40 stores lower limit temperatures $Ts_3$ related to temperature peaks $T_H$ of the cooling plate assembly 5. The second table memory 41 stores duty ratios of electric currents corresponding to radiating water temperatures $T_N$. The lower limit temperatures $Ts_3$ and duty ratios of currents are empirically determined beforehand, and details thereof will be described hereinafter.

The controller 23 in the fifth embodiment also comprises a microcomputer but has the following functions: a writing function to store in the first set temperature memory 24 the first set temperature $Ts_1$ received from the input unit 20; a duty ratio setting function to read from the second table memory 41 and output to the temperature controller 26 a duty ratio corresponding to the temperature of radiating water detected by the radiating water temperature sensor 18 upon receipt of the wafer delivery signal from the placement sensor 35 indicating placement of wafer W on the cooling plate assembly 5; a peak detecting function to detect a peak of the temperature of the plate assembly 5 based on detection by the plate temperature sensor 16; a lower limit temperature determining function to read from the first table memory 40 a lower limit temperature $Ts_3$ related to the temperature peak $T_H$ detected; a deciding function to decide that the temperature of the cooling plate assembly 5 detected by the plate temperature sensor 16 has become the lower limit temperature $Ts_3$ determined; a PID control instructing function to instruct start of PID control by reading the first set temperature $Ts_1$ from the first set temperature memory 24 and outputting the first set temperature $Ts_1$ as target temperature for PID control to the temperature controller 26 when the temperature of the plate assembly 5 has become the lower limit temperature $Ts_3$. a timer function to measure passage of a cooling time $t_E$ set in advance; and a pin control function to output a pin lowering command and a pin raising command to the wafer drive unit 27 for lowering and raising the wafer support pins 7 in response to results of the above timer function or the wafer delivery signal from the transport control unit 21. While details concerning the duty ratio will be described hereinafter, the output to the temperature controller 26 of the duty ratio set by the duty ratio setting function noted above also serves as an instruction for the temperature controller 26 to start a duty control.

The temperature controller 26 also comprises a microcomputer. The temperature controller 26 in the fifth embodiment stores a known program for performing the PID control, and a known program for performing the duty control. These two functions are selected under control of the controller 23. In the PID control, as in the first embodiment, the temperature controller 26 controls Peltier elements 15 to a predetermined target temperature outputted from the controller 23, by referring to temperature Tp of the cooling plate assembly 5 measured by the plate temperature sensor 16 and outputting a control signal to the cooling drive unit 28. In the duty control function, the temperature controller 26 outputs to the cooling drive unit 28 a control signal corresponding to the duty ratio outputted from the controller 23, to control the electric current applied to Peltier elements 15 and drive Peltier elements 15 at a normalized maximum cooling output described hereinafter. Each of the controller 23 and temperature controller 26 in the fifth embodiment comprises a single microcomputer to perform the above functions. Instead, separate circuits having the respective functions may be provided.

The other aspects of the fifth embodiment are the same as in the first embodiment. Thus, in FIG. 15, like parts are labeled with like references with respect to FIG. 5, and will not be described again.

In the fifth embodiment, wafer W is cooled quickly and efficiently by controlling the plate temperature Tp under optimal conditions, and causing wafer temperature Tw to approach the target temperature (first set temperature $Ts_1$) quickly. These controls will particularly be described hereinafter.

Figure 16:
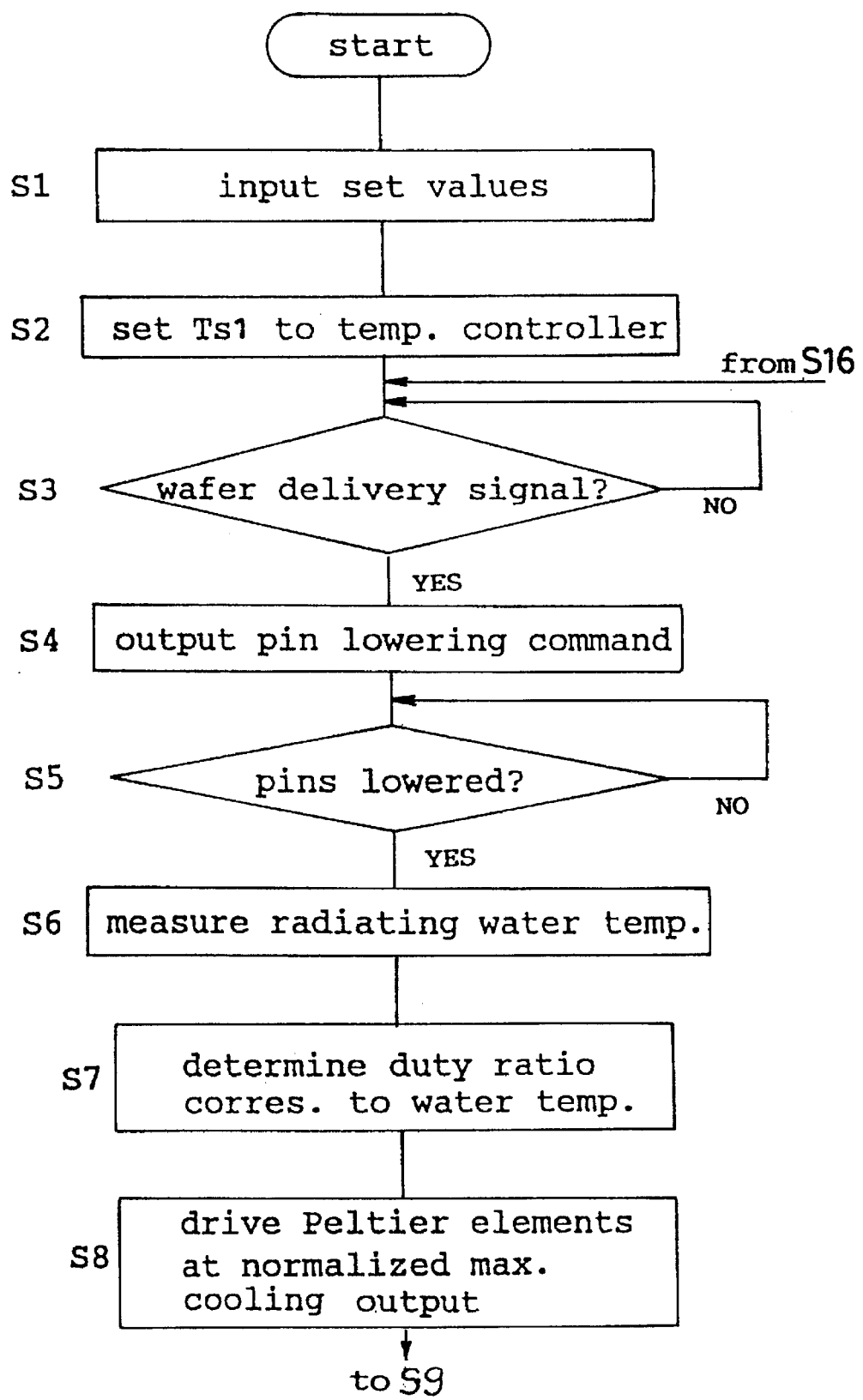
FIG. 16 is a flowchart of a control operation in the fifth embodiment.
Figure 17:
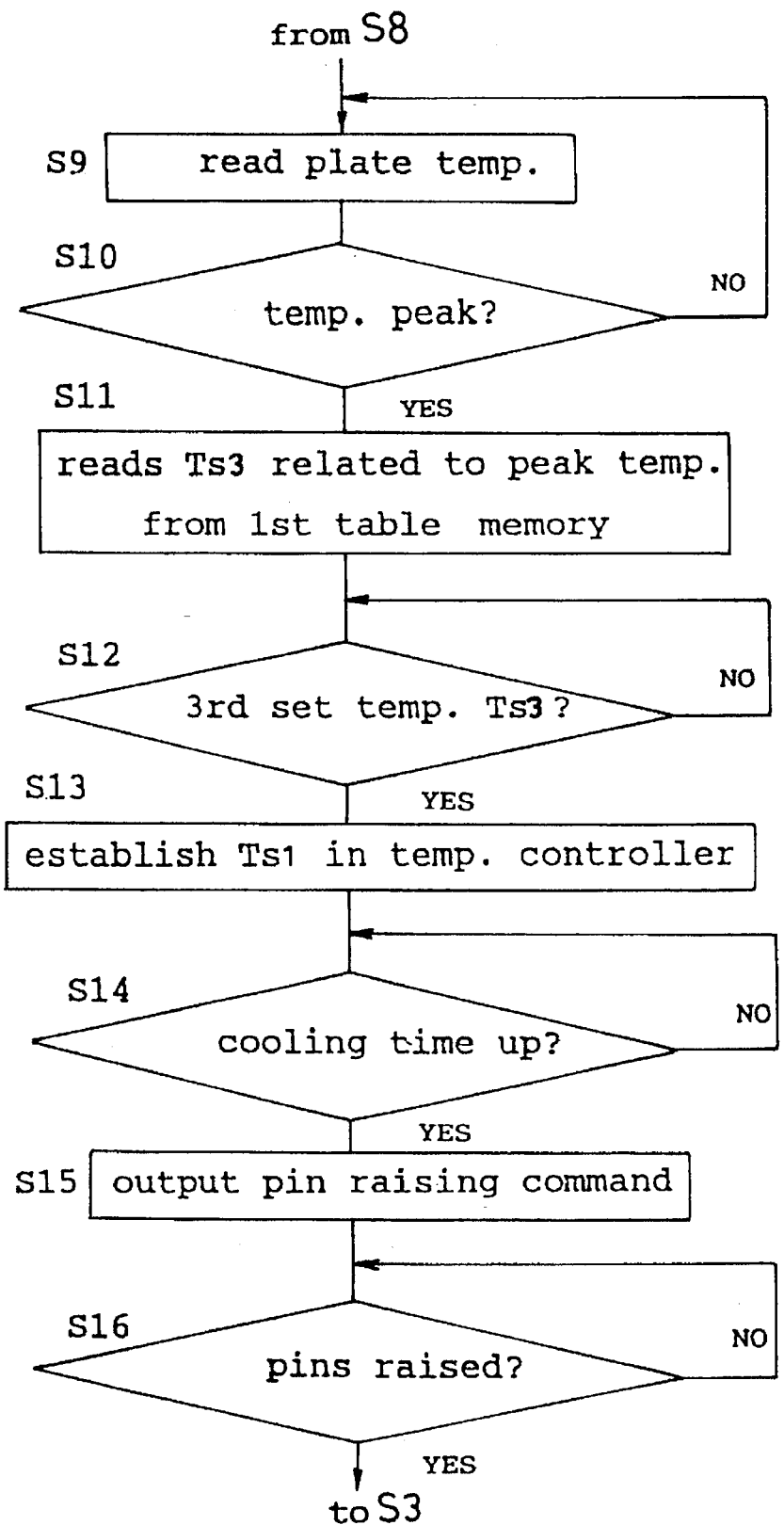
FIG. 17 is a further flowchart of the control operation in the fifth embodiment.
Figure 18:
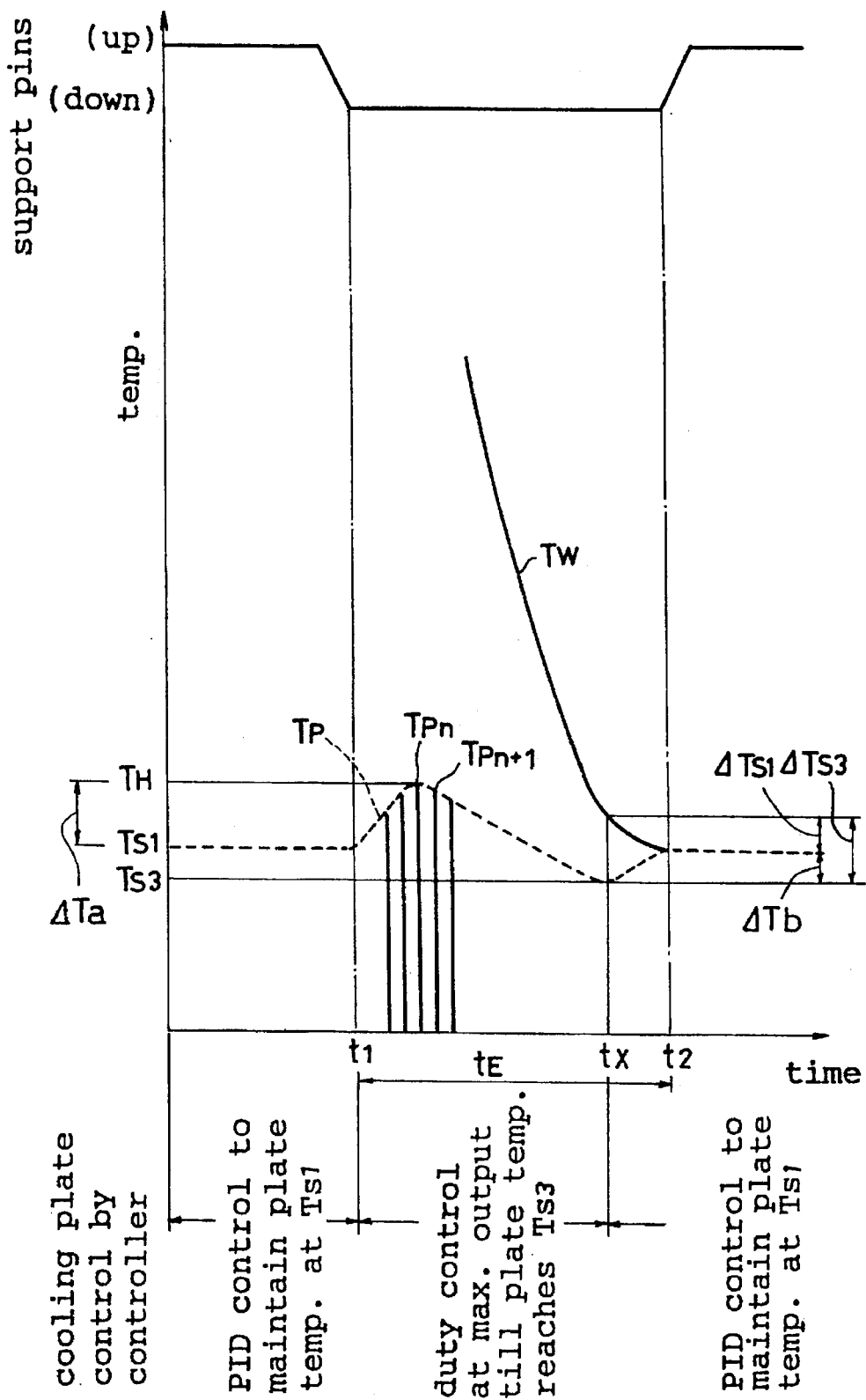
FIG. 18 is a time chart illustrating the operation in the fifth embodiment.

The cooling controls of the above system (substrate cooling method) will be described with reference to the flow charts of FIGS. 16 and 17 and the time charts of FIG. 18 illustrating operation of the controller 23. FIG. 18 shows, in an upper portion thereof, transport timing of wafers W based on vertical movement of the wafer support pins 7 and, in a lower portion, temperature changes of the wafers W and cooling plate assembly 5. In FIG. 18, wafer temperature Tw is shown in a solid line, and plate temperature Tp in a broken line. At cooling starting time t1, wafer W is placed on the cooling plate assembly 5 and a cooling operation is started. Immediately after the cooling starting time t1, wafer W remains hot and a corresponding portion of its temperature is omitted from FIG. 18.

Step 1: The set values are first inputted through the input unit 20. These set values include the first set temperature $Ts_1$, and wafer cooling time $t_E$.

Step 2: Then, the controller 23 outputs the first set temperature $Ts_1$ as target temperature for the PID control to the temperature controller 26 before wafer W is placed on the cooling plate assembly 5, i.e. before cooling starting time t1. As a result, the first set temperature $Ts_1$ is established in the temperature controller 26 as the target temperature for the PID control of Peltier elements 15. Then, as shown in FIG. 18, the temperature controller 26 drives Peltier elements 15 under PID control so that temperature Tp of the cooling plate assembly 5 becomes the first set temperature $Ts_1$. As a result, by the time wafer W is placed on the cooling plate assembly 5, plate temperature Tp has been maintained at the first set temperature $Ts_1$ to which wafer W is to be cooled.

Steps 3, 4 and 5: Next, the controller 23 checks whether a wafer delivery signal has been outputted from the transport control unit 21, that is whether wafer W has been placed on the wafer support pins 7 or not. When wafer W has been placed on the wafer support pins 7, the controller 23 outputs a pin lowering command for causing the wafer drive unit 27 to contract the air cylinder 10. Consequently, the wafer support pins 7 are lowered to place wafer W on the proximity balls 8 on the cooling plate assembly 5. Thus, wafer W is placed above and adjacent the plate assembly 5. A cooling operation for wafer W is started then (at point of time t1). The controller 23 determines from the wafer placement signal received from the placement sensor 35 whether lowering of the support pins 7 is completed. The operation moves to step 6 if the pins 7 have been lowered. Step 6 may be executed after a determination that wafer W has been placed on the cooling plate assembly 5 based on lapse of the time required for descent of the wafer support pins 7 from output of the pin lowering command to the wafer drive unit 27.

Steps 6, 7 and 8: The controller 23 reads temperature $T_N$ of radiating water flowing through the water supply pipe 12, from the radiating water temperature sensor 18 through the temperature controller 26. Based on the radiating water temperature $T_N$ read, the controller 23 determines a duty ratio of output current from the second table memory 41, and starts driving Peltier elements 15 at the normalized maximum cooling output.

The normalized maximum cooling output will be described here. Peltier elements 15 arranged on the plate assembly 5 have such a characteristic that the cooling power thereof is variable, even if a constant electric current is applied thereto, under the influences of ambient temperature, radiating water temperature of the radiating plate 14, flow rate of the radiating water, plate temperature and so on. Ambient temperature has little influence since the cooling plate assembly 5 is used at or adjacent room temperature.

The flow rate of the radiating water may be substantially fixed by providing a regulator or flow control valve. The plate temperature, though slightly variable during treatment, presents no problem with respect to uniformity of wafer treatment since the variation follows the same pattern for all wafers W as long as wafers W of the same type are treated at the same temperature.

However, temperature $T_N$ of radiating water is widely variable since usually tap water is used. It is difficult to control the temperature of tap water to be constant, its temperature being variable with atmospheric temperature. The variations in the temperature of radiating water influence the cooling power of Peltier elements 15. That is, even if a fixed electric current is supplied from the cooling drive unit 28 to Peltier elements 15, the cooling power of Peltier elements 15 is influenced by variations in the temperature $T_N$ of radiating water which radiates heat of Peltier elements 15. When, for example, hot radiating water is supplied, Peltier elements 15 exhibit a low cooling performance even if a maximum electric current is supplied thereto. When cold radiating water is supplied, Peltier elements 15 exhibit an increased cooling performance with the same electric current.

Figure 19:
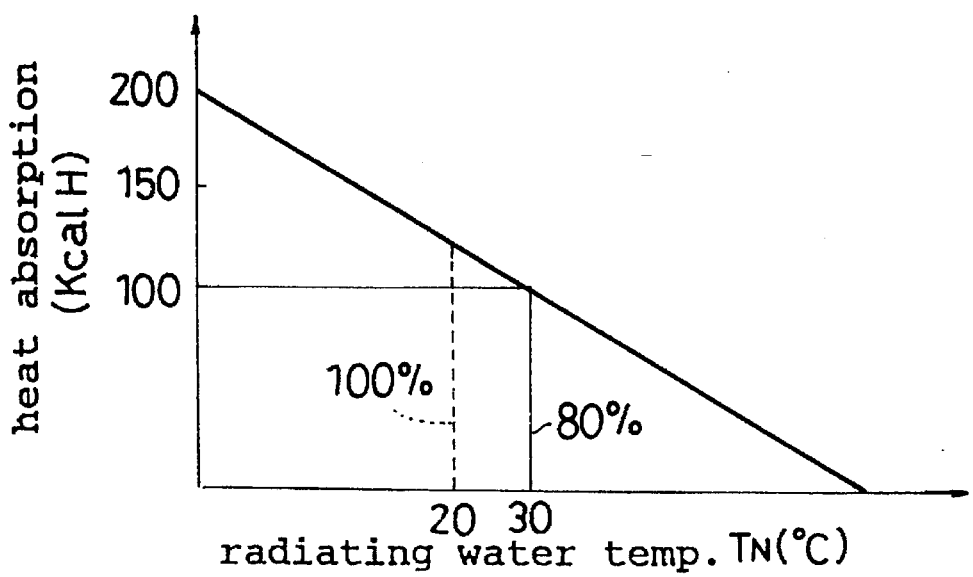
FIG. 19 is an explanatory view of a second table memory.
Figure 20A:
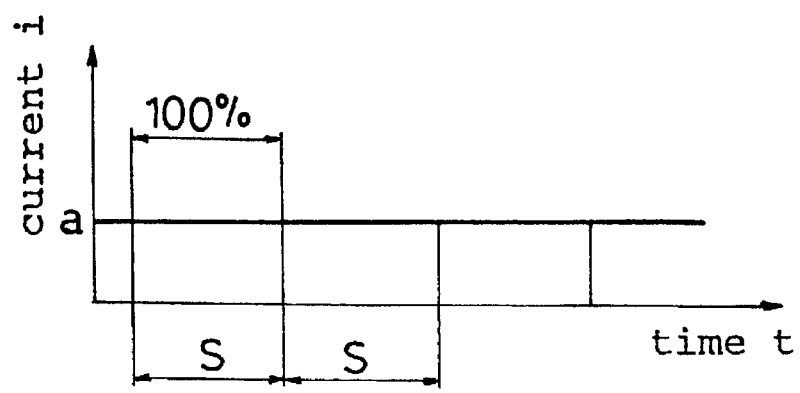
FIGS. 20A and 20B are explanatory views of duty ratios of electric currents.
Figure 20B:
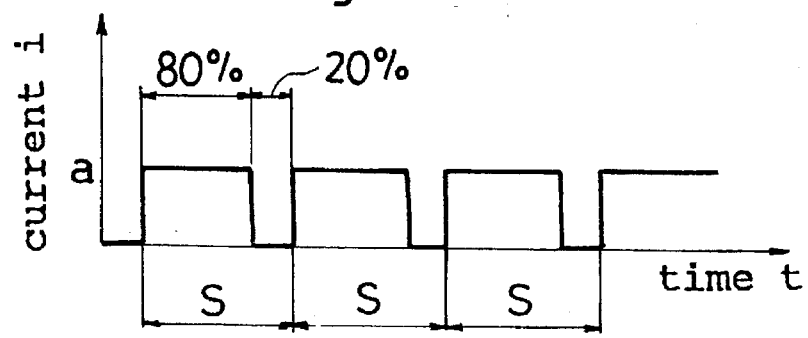

Thus, in the fifth embodiment, the duty ratio of the electric current outputted to Peltier elements 15 is controlled based on the temperature of radiating water, whereby a maximum cooling performance is obtained at all times regardless of the radiating water temperature. This feature will be described in greater detail with reference to FIGS. 19, 20A and 20B. FIG. 19 shows a relationship between radiating water temperature $T_N$ and heat absorption Q by the radiating plate 14. FIG. 20A shows an output control of current i when radiating water temperature $T_N$ is at a reference temperature, e.g. 30° C. FIG. 20B shows an output control of current i when radiating water temperature $T_N$ is at 20° C.

Generally, as shown in FIG. 19, heat absorption Q which is the cooling power of radiating plate 14 decreases with an increase in the radiating water temperature $T_N$. Assume, for example, that heat absorption Q is 100% when radiating water temperature $T_N$ is 20° C., and 80% when the latter is 30° C., with the electric current remaining unchanged. In this case, the cooling power available when radiating water temperature $T_N$ is 30° C. is regarded as reference, as shown in FIG. 20A. When radiating water temperature $T_N$ is 20° C., as shown in FIG. 20B, electric current i supplied to Peltier elements 15 is divided into appropriate cycles S. The output is reduced to 80% so that heat absorption Q equalizes that available when radiating water temperature $T_N$ is at the reference temperature of 30° C. That is, when radiating water temperature $T_N$ is at the reference temperature of 30° C., the electric current at fixed value "a" is continuously supplied to Peltier elements 15. When radiating water temperature $T_N$ is 20° C., the electric current is controlled to be in ON/OFF pulses so that the current at fixed value "a" is supplied to Peltier elements 15 in the ratio of 80 (ON) to 20 (OFF) within the respective cycles. In this way, the current at fixed value "a" is simply controlled to be in ON/OFF pulses, thereby facilitating correction of the maximum cooling output. Thus, a fixed maximum cooling performance is obtained at all times regardless of variations in radiating water temperature $T_N$. This is referred to herein as normalized maximum cooling output (or predetermined high cooling output). The duty ratios corresponding to radiating water temperatures $T_N$ derived from the graph shown in FIG. 19 are empirically determined beforehand. The radiating water temperature $T_N$ regarded as the reference is the highest temperature of water supplied to the apparatus.

Steps 9 and 10: When cooling of wafer W is started, the controller 23 successively reads, through the temperature controller 26, temperature Tp of the cooling plate assembly 5 detected by the plate temperature sensor 16. Then, as in the first embodiment, the controller 23 determines whether plate temperature Tp has reached temperature peak $T_H$.

Step 11: When plate temperature Tp reaches temperature peak $T_H$, the controller 23 reads lower limit temperature $Ts_3$ corresponding to temperature peak $T_H$ from the first table memory 40.

The first table memory 40 stores, as shown in FIG. 18, temperature difference $\Delta Ta$ between temperature peak $T_H$ and first set temperature (target temperature) $Ts_1$, and temperature difference $\Delta Tb$ between first target temperature $Ts_1$ and lower limit temperature $Ts_3$ corresponding to temperature difference $\Delta Ta$, which are empirically determined beforehand. Temperature difference $\Delta Ta$ is determined from the initial temperature or size of wafer W. Temperature difference $\Delta Tb$ is empirically determined with reference to temperature difference $\Delta Ta$, so that plate temperature Tp and wafer temperature Tw reach the target temperature (first set temperature $Ts_1$) at the same point of time (cooling finishing time t2). A difference in cooling time due to varied lower limit temperatures $Ts_3$ will be described hereinafter.

Steps 12 and 13: The controller 23 checks whether plate temperature Tp has reached lower limit temperature $Ts_3$. When plate temperature Tp has reached lower limit temperature $Ts_3$, the first set temperature $Ts_1$ is established in the temperature controller 26 as target temperature for PID control. That is, as shown in FIG. 18, at point of time t2 when plate temperature reaches lower limit temperature $Ts_3$, the temperature controller 26 finishes the cooling operation at the normalized maximum cooling output started at step 8, and starts driving Peltier elements 15 under PID control to maintain plate temperature Tp at the first set temperature $Ts_1$.

Temperature variations occurring during the wafer cooling operation in the fifth embodiment will be described with reference to the time chart of FIG. 18.

When wafer W to be cooled is placed on the cooling plate assembly 5 at cooling starting time t1, wafer temperature Tw is high (e.g. 100° C. or above). As shown in FIG. 18, wafer temperature Tw is absorbed by the cooling plate assembly 5 and begins to fall rapidly. The quantity of heat transfer, due to the absorption, from wafer W to cooling plate assembly 5 is greater than the quantity of heat transfer from cooling plate assembly 5 to Peltier elements 15 resulting from the cooling action of the latter. As a result, plate temperature Tp is temporarily raised by temperature Tw of wafer W. From point of time t1 to point of time tx when the lower limit temperature $Ts_3$ is reached, Peltier elements 15 are forcefully driven at the normalized maximum cooling output to check the increase of plate temperature Tp under the influence of wafer temperature Tw. Consequently, plate temperature Tp is restored quickly, thereby to lower wafer temperature Tw quickly.

The difference in cooling time resulting from the normalized maximum cooling output and that not normalized will be described with reference to FIG. 21.

Figure 21:
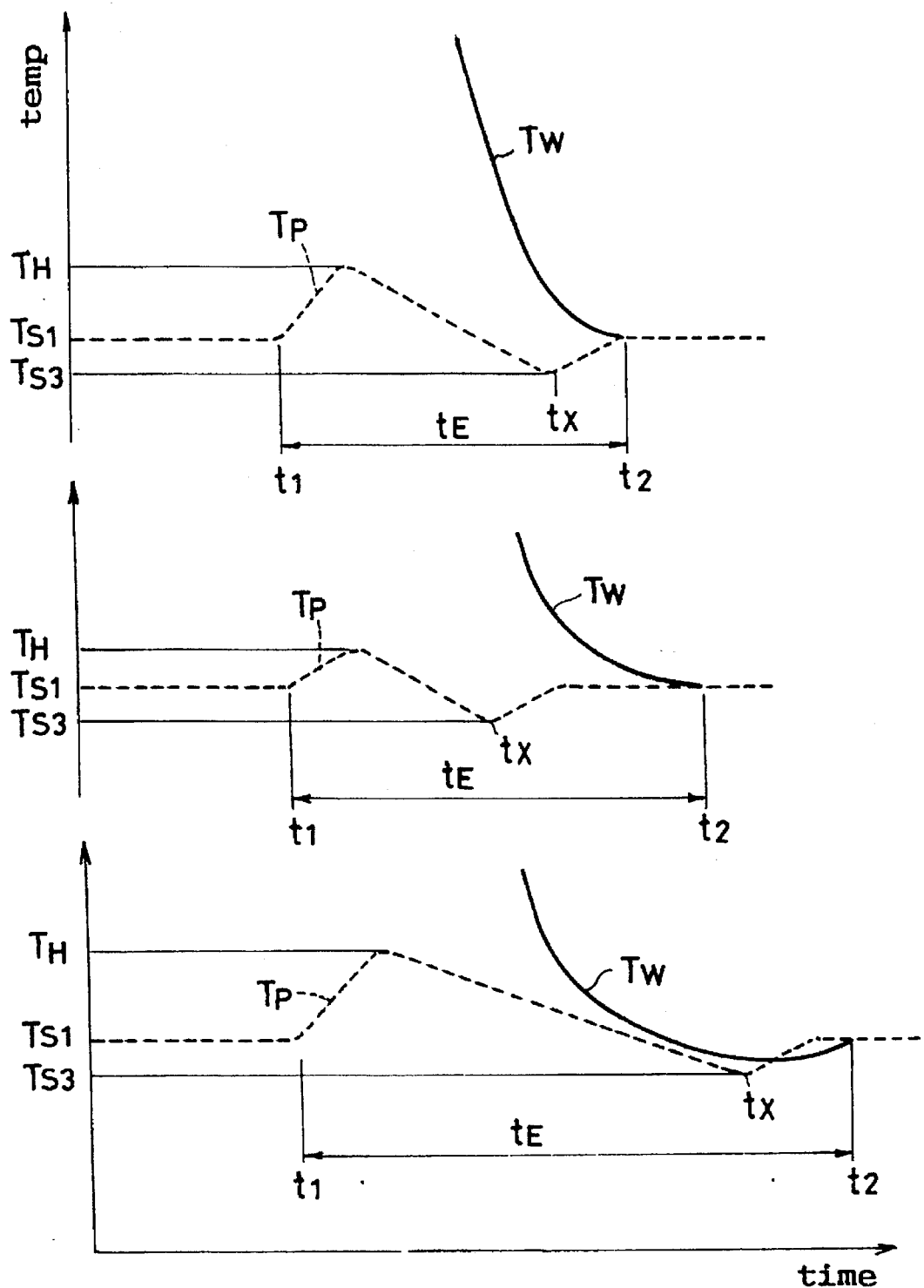
FIG. 21 is an explanatory view of a difference in substrate cooling time between normalized maximum cooling output and not normalized output.

FIG. 21 shows a time chart in an upper portion thereof in which cooling is done at the normalized maximum cooling output, a time chart in a middle portion in which the cooling output not normalized increases, and a time chart in a lower portion in which the cooling output not normalized decreases. It is assumed here that lower limit temperature $Ts_3$ remains unchanged with variations in temperature peak $T_H$.

Where the maximum cooling output is normalized, as shown in the upper portion of FIG. 21, both plate temperature Tp and wafer temperature Tw reach the target temperature (first set temperature $Ts_1$) at cooling finishing time t2. Plate temperature Tp and wafer temperature Tw are wide apart before reaching the target temperature, which means that wafer W is cooled efficiently.

Where the cooling output increases with cold radiating water supplied, as shown in the middle portion of FIG. 21, plate temperature Tp increases by a limited degree and reaches lower limit temperature $Ts_3$ early. Consequently, after point of time tx, cooling is effected under PID control with the first set temperature $Ts_1$ acting as target temperature. That is, little effect is derived from the shortened cooling time based on the maximum cooling output since cooling at the normalized maximum output is terminated early. Besides, plate temperature Tp is controlled to approach the first set temperature $Ts_1$ after start of the PID control using the first set temperature $Ts_1$ as target temperature. This diminishes the difference between plate temperature Tp and wafer temperature Tw toward the end of the cooling operation. Consequently, it takes time for wafer temperature Tw to reach the target temperature, extending wafer cooling time $t_E$.

Where the cooling output decreases with hot radiating water supplied, as shown in the lower portion of FIG. 21, peak $T_H$ of plate temperature Tp is increased and time tx at which plate temperature Tp reaches lower limit temperature $Ts_3$ is delayed. Wafer W is sufficiently cooled during this period, so that wafer temperature Tw, along with plate temperature Tp, falls below the target temperature Ts. Consequently, it takes time for wafer temperature Tw to reach the target temperature, extending wafer cooling time $t_E$.

A difference in cooling time due to varied lower limit temperatures $Ts_3$ will be described with reference to FIG. 22.

Figure 22:
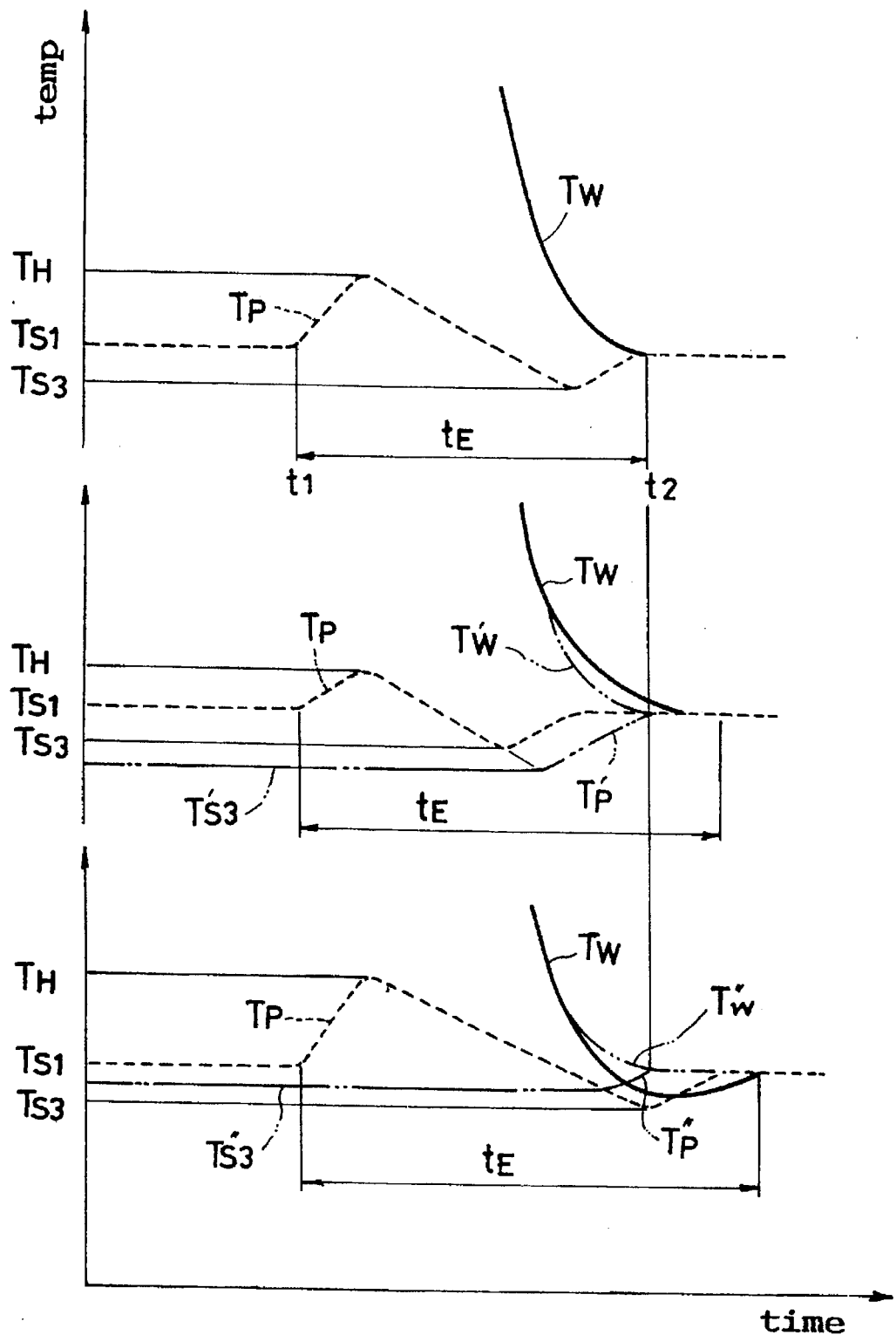
FIG. 22 is an explanatory view of a difference in substrate cooling time between a second temperature properly set and that improperly set.

FIG. 22 shows a time chart in an upper portion thereof in which proper lower limit temperature $Ts_3$ is set according to the initial temperature or size of wafer W, and time charts in a middle portion and a lower portion in which proper lower limit temperature $Ts_3$ is not set. The middle portion is a time chart in which wafer W at a low initial temperature (or small wafer W) is introduced. The lower portion is a time chart in which wafer W at a high initial temperature (or large wafer W) is introduced. The same lower limit temperature $Ts_3$ is set in the middle and lower time charts as in the upper time chart of FIG. 22.

Where proper lower limit temperature $Ts_3$ is set, as shown in the upper portion of FIG. 22, both plate temperature Tp and wafer temperature Tw reach the target temperature (first set temperature $Ts_1$) at cooling finishing time t2. Plate temperature Tp and wafer temperature Tw are wide apart before reaching the target temperature, which means that wafer W is cooled efficiently.

Where cold wafer W is placed on the cooling plate assembly 5 with the same lower limit temperature $Ts_3$ set, as shown in the middle portion of FIG. 22, plate temperature Tp increases by a limited degree and reaches lower limit temperature $Ts_3$ early. Consequently, after point of time tx, cooling is effected under PID control with the first set temperature $Ts_1$ acting as target temperature. That is, little effect is derived from the shortened cooling time based on the maximum cooling output since cooling at the normalized maximum output is terminated early. Besides, plate temperature Tp is controlled to approach the first set temperature $Ts_1$ after start of the PID control using the first set temperature $Ts_1$ as target temperature. This diminishes the difference between plate temperature Tp and wafer temperature Tw toward the end of the cooling operation. Consequently, it takes time for wafer temperature Tw to reach the target temperature, extending wafer cooling time $t_E$.

Where hot wafer W is placed on the cooling plate assembly 5 with the same lower limit temperature $Ts_3$ set, as shown in the lower portion of FIG. 22, peak $T_H$ of plate temperature Tp is increased and time tx at which plate temperature Tp reaches lower limit temperature $Ts_3$ is delayed. Wafer W is sufficiently cooled during this period, so that wafer temperature Tw, along with plate temperature Tp, falls below the target temperature Ts. Consequently, it takes time for wafer temperature Tw to reach the target temperature, extending wafer cooling time $t_E$.

Thus, in the fifth embodiment, controls are effected as shown in two-dot-and-dash lines in the middle and lower portions of FIG. 22. Specifically, lower limit temperature $T's_3$ is set low where wafer W is cold and temperature peak $T'_H$ is low. This setting causes both plate temperature T'p and wafer temperature T'w to reach the target temperature at cooling finishing time t2. Lower limit temperature $T''s_3$ is set high where wafer W is hot and temperature peak $T''_H$ is high. This setting causes both plate temperature T"p and wafer temperature T"w to reach the target temperature at cooling finishing time t2. In treating a plurality of wafers W at different initial temperatures, wafers W are caused to reach the target temperature at the same point of time. Thus, wafer cooling time is made substantially invariable regardless of the initial temperature (or size) of each wafer W.

Reverting to FIG. 18, when plate temperature Tp has reached proper lower limit temperature $Ts_3$ corresponding to temperature peak $T_H$ (point of time tx), the first set temperature $Ts_1$ is established in the temperature controller 26 as the target temperature for the PID control of Peltier elements 15. With plate temperature Tp subjected to PID control with the first set temperature $Ts_1$ acting as target, wafer temperature Tw is lowered with high precision without becoming below the first set temperature $Ts_1$. At point of time tx, plate temperature Tp and wafer temperature Tw have temperature difference $\Delta Ts_3$ (e.g. 0.5° C.) which is larger than temperature difference $\Delta Ts_1$ (e.g. 0.3° C.) between target temperature (first set temperature $Ts_1$) and wafer temperature Tw in the prior art. Thus, a quicker heat transfer takes place, causing wafer temperature Tw to reach the first set temperature $Ts_1$ quickly. Consequently, wafer temperature Tw is lowered to the first set temperature $Ts_1$ quickly and accurately. Besides, since wafer W is cooled precisely to the target temperature, no adverse influence is exerted on film thickness distribution in a subsequent process of applying a photoresist solution to the semiconductor wafer, for example. In order to accommodate variations in the initial temperature of wafer W, wafer cooling time $t_E$ may be set slightly longer than the time taken for wafer temperature Tw to reach the target temperature.

Reference is made to the flowcharts in FIGS. 16 and 17 again.

Steps 14, 15 and 16: Next, the controller 23 checks whether the predetermined wafer cooling time $t_E$ is up. If cooling time $t_E$ is up, at cooling finishing time t2. the controller 23 gives a pin raising command to the wafer drive unit 27. Consequently, wafer W is raised above the cooling plate assembly 5 to complete the cooling treatment. Then, the operation returns to step 3 to maintain plate temperature Tp at the first set temperature $Ts_1$ until next wafer W is placed on the cooling plate assembly 5. By repeating the foregoing operations, a plurality of wafers W are cooled to the first set temperature $Ts_1$ which is room temperature, e.g. 20° C. Wafers W cooled are transferred to a next process.

According to the above operations, a plurality of wafers W are cooled quickly and efficiently in the same cooling time (cooling history). This provides an improved throughput of the substrate cooling apparatus 2, and hence an improved throughput of the wafer cooling treatment.

Sixth Embodiment

Figure 23:
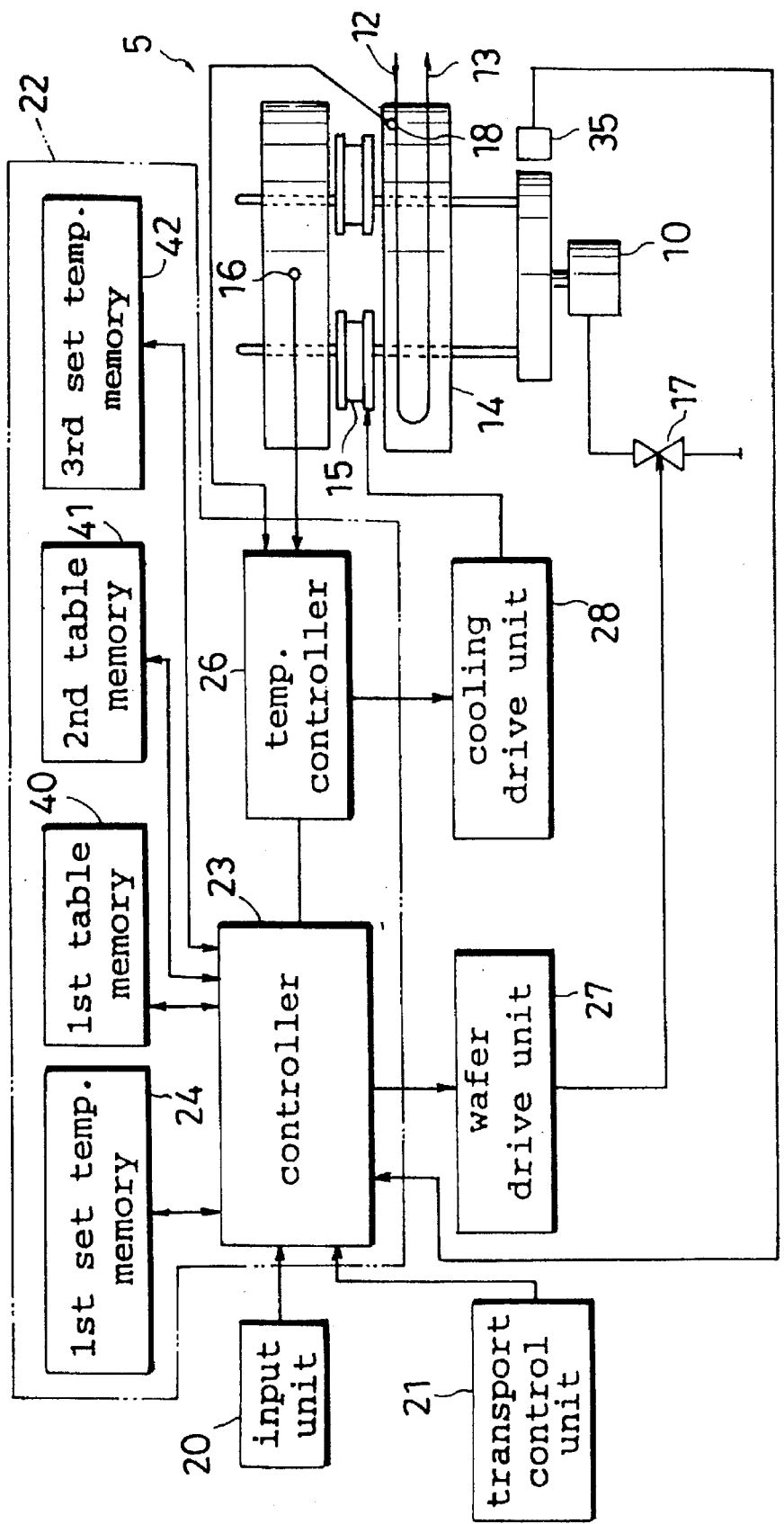
FIG. 23 is a block diagram of a control system in a sixth embodiment of the present invention.

In the substrate cooling apparatus in the sixth embodiment, as shown in FIG. 23, the control unit 22 in the fifth embodiment additionally includes a third set temperature memory 42 acting as the preliminary cooling temperature storage for storing a preliminary cooling temperature $Ts_4$ lower than the first set temperature $Ts_1$. The other aspects of the construction are the same as in the fifth embodiment, and will not be described again.

Figure 24:
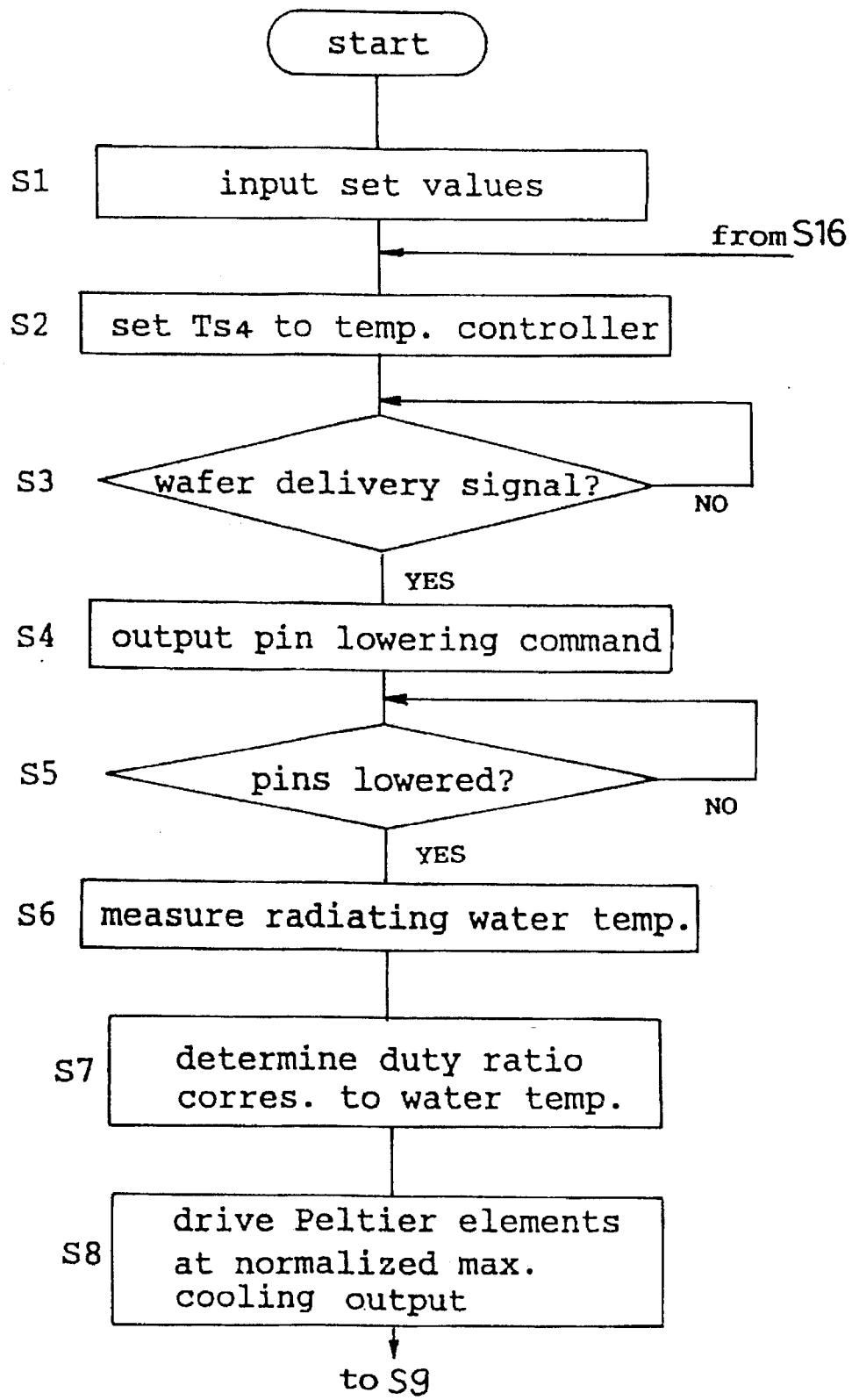
FIG. 24 is a flowchart of a control operation in the sixth embodiment.
Figure 25:
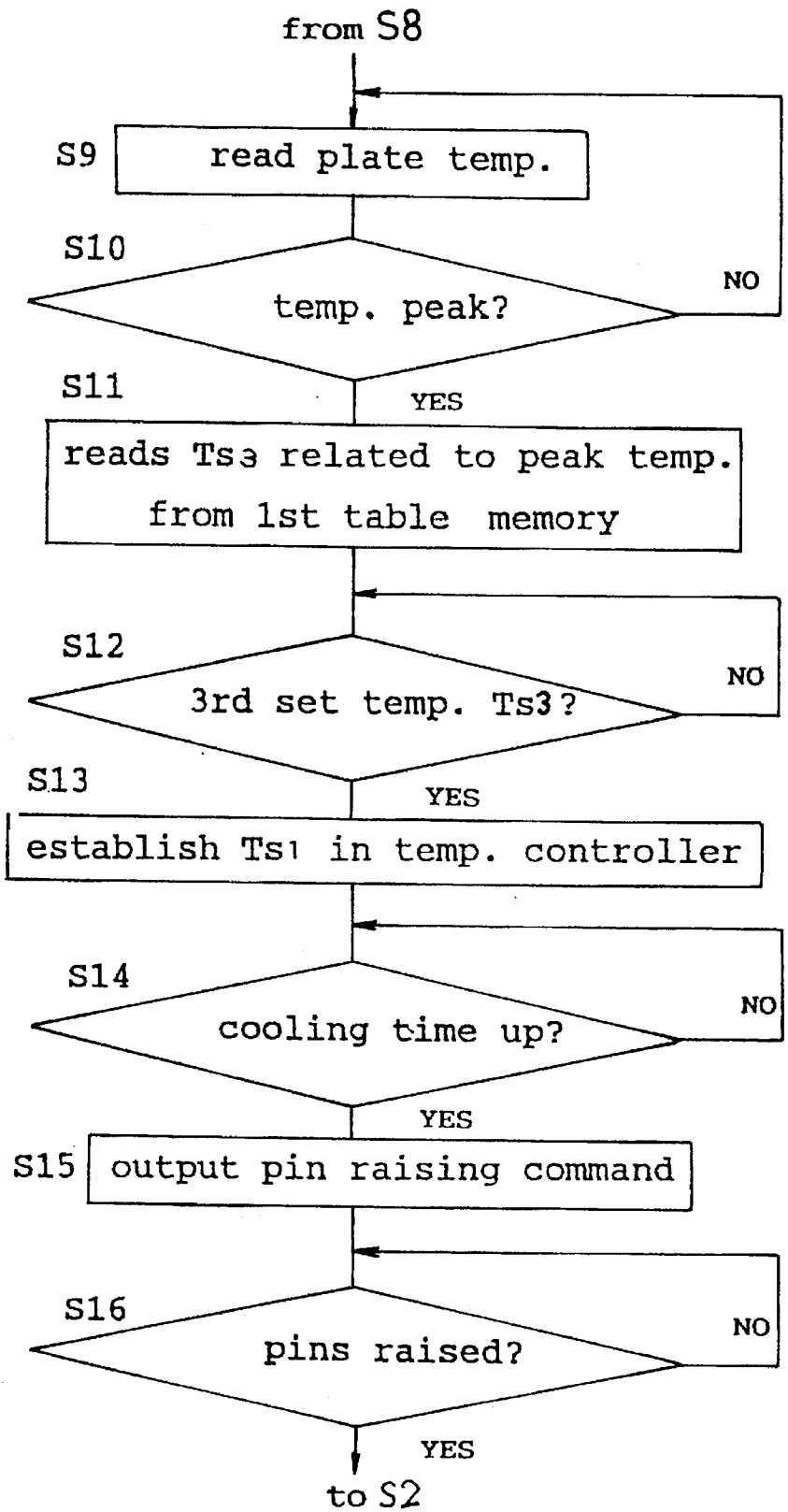
FIG. 25 is a further flowchart of the control operation in the sixth embodiment.

The cooling controls peculiar to the sixth embodiment (substrate cooling method) will be described with reference to the flow charts of FIGS. 24 and 25 and the time chart of FIG. 26.

Step 1: The set values are first inputted through the input unit 20. These set values include the first set temperature $Ts_1$, wafer cooling time $t_E$ and preliminary cooling temperature $Ts_4$.

The controller 23 stores the first set temperature $Ts_1$ in the first set temperature memory 24, and the preliminary cooling temperature $Ts_4$ in the preliminary cooling temperature memory 42. The first set temperature $Ts_1$ is 20° C., for example, which is the target temperature to which wafer W is to be cooled. The preliminary cooling temperature $Ts_4$ is 18° C., for example, which is lower than the first set temperature $Ts_1$. The preliminary cooling temperature $Ts_4$ is empirically determined, as is the second set temperature $Ts_2$ in the first embodiment, according to the type of wafer W, the capacity of Peltier elements 15, and the like.

Step 2: Then, the controller 23 outputs the preliminary cooling temperature $Ts_4$ as target temperature for the PID control to the temperature controller 26 before wafer W is placed on the cooling plate assembly 5, i.e. before cooling starting time t1. As a result, the preliminary cooling temperature $Ts_1$ is established in the temperature controller 26 as target temperature for the PID control of Peltier elements 15. Then, as shown in FIG. 26, the temperature controller 26 drives Peltier elements 15 under PID control so that temperature Tp of the cooling plate assembly 5 becomes the preliminary cooling temperature $Ts_4$. As a result, by the time wafer W is placed on the cooling plate assembly 5, plate temperature Tp has been maintained at the preliminary cooling temperature Ts lower than the first set temperature $Ts_1$ to which wafer W is to be cooled.

Steps 3 through 16: With plate temperature Tp set to the preliminary cooling temperature $Ts_4$, wafer W is placed on the cooling plate assembly 5 and a cooling operation is started as at steps 3 through 16 in the fifth embodiment. That is, as shown in FIG. 26, after cooling starting time t1, the controller 23 determines a duty ratio of output current from the second table memory 41 based on the radiating water temperature $T_N$, and starts driving Peltier elements 15 at the normalized maximum cooling output. Then, the controller 23 reads, from the first table memory 40, lower limit temperature $Ts_3$ related to temperature peak $T_H$. At point of time tx when plate temperature Tp reaches the lower limit temperature $Ts_3$, the temperature controller 26 drives Peltier elements 15 under PID control to set plate temperature Tp to the first set temperature $Ts_1$. Consequently, wafer temperature Tw is lowered with high precision without becoming below the first set temperature $Ts_1$.

When cooling time $t_E$ is up, the operation returns to step 2 to reinstate plate temperature Tp at the preliminary cooling temperature $Ts_4$ before start of a cooling operation for next wafer W. By repeating the foregoing operations, a plurality of wafers W are cooled to the first set temperature $Ts_1$ which is room temperature, e.g. 20° C. Wafers W cooled are transferred to a next process.

Thus, wafers W are cooled quickly in the sixth embodiment, as in the fifth embodiment. In the sixth embodiment in particular, plate temperature Tp has been set to the preliminary cooling temperature $Ts_4$ by cooling starting time t1, so that wafer temperature Tw and plate temperature Tp are widely different immediately after wafer W is placed on the cooling plate assembly 5. As a result, wafer temperature Tw is lowered quickly. Up to point of time tx when the lower limit temperature $Ts_3$ is reached, Peltier elements 15 are driven at the normalized maximum cooling output to check the increase of plate temperature Tp under the influence of wafer temperature Tw. Consequently, plate temperature Tp is restored quickly, thereby to lower wafer temperature Tw quickly.

In the fifth and sixth embodiments, Peltier elements 15 are driven under PID control before cooling of wafer W is started and after the lower limit temperature $Ts_3$ is reached. However, the present invention is not limited to this mode, but ON/OFF control may be employed. It is in accordance with the invention as long as the cooling plate assembly 5 is controlled so that plate temperature Tp reach the first set temperature $Ts_1$ or preliminary cooling temperature $Ts_4$.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate cooling method for cooling a substrate placed in position contacting or adjacent a cooling plate having cooling means, said method comprising the steps of:

controlling said cooling means to cool said cooling plate such that, by a point of time when said substrate is placed in position, said cooling plate is maintained below a target temperature to which said substrate is to be cooled;

switching control of said cooling means at a predetermined time after said substrate is placed in position, to increase the temperature of said cooling plated to said target temperature; and wherein said predetermined time is set to a point of time when the temperature of said cooling plate reaches a peak of temperature increase after said substrate in placed in position.

2. A substrate cooling method for cooling a substrate placed in position contacting or adjacent a cooling plate having cooling means, said method comprising the steps of:

controlling said cooling means to cool said cooling plate such that, by a point of time when said substrate is placed in position, said cooling plate is maintained below a target temperature to which said substrate is to be cooled;

switching control of said cooling means at a predetermined time after said substrate is placed in position, to increase the temperature of said cooling plated to said target temperature; and wherein said predetermined time is set to a point of time when a predetermined period of time elapses after said substrate is placed in position.

3. A substrate cooling method for cooling a substrate placed in position contacting or adjacent a cooling plate having cooling means, said method comprising the steps of:

controlling said cooling means to cool said cooling plate such that, by a point of time when said substrate is placed in position, said cooling plate is maintained below a target temperature to which said substrate is to be cooled;

switching control of said cooling means at a predetermined time after said substrate is placed in position, to increase the temperature of said cooling plated to said target temperature; and wherein said predetermined time is set to a point of time when placement of said substrate in position is detected.

4. A substrate cooling method as defined in claim 1, further comprising the step of inputting an initial temperature of said substrate to be cooled, wherein said temperature below said target temperature is determined in relation to said initial temperature.

5. A substrate cooling method for cooling a substrate placed in position contacting or adjacent a cooling plate having cooling means, said method comprising the steps of:

controlling said cooling means to cool said cooling plate such that, before said substrate is placed in position, said cooling plate is maintained at a predetermined temperature;

controlling said cooling means at a predetermined high cooling output at a point of time when said substrate is placed in position;

detecting a peak of temperature increase reached by said cooling plate;

determining, when said cooling plate reaches said peak of temperature increase, a lower limit temperature related to said peak of temperature increase and below a target temperature to which said substrate is to be cooled; and switching control of said cooling means, when said cooling plate reaches said lower limit temperature, to increase the temperature of said cooling plate to said target temperature.

6. A substrate cooling method as defined in claim 5, wherein said predetermined temperature at which said cooling plate is maintained before said substrate is placed in position equals said target temperature.

7. A substrate cooling method as defined in claim 5, wherein said predetermined temperature at which said cooling plate is maintained before said substrate is placed in position is a preliminary cooling temperature below said target temperature.

8. A substrate cooling method as defined in claim 5, wherein said cooling means comprises Peltier elements, said Peltier elements being controlled at said predetermined high cooling output at said point of time when said substrate is placed in position, by an electric current outputted to said Peltier elements in pulses under ON/OFF control with a duty ratio determined based on a maximum cooling power of said Peltier elements for a maximum temperature of radiating water supplied to a radiating plate disposed at a radiating side of said Peltier elements, and on a reference electric current outputted to said Peltier elements for driving said Peltier elements at said maximum cooling power at said maximum temperature of said radiating water, such that said duty ratio, with respect to said reference electric current, of an electric current required to drive said Peltier elements at said maximum cooling power at a measured temperature of radiating water actually supplied to said radiating plate is determined from a ratio between heat absorption of said radiating plate at said measured temperature of said radiating water and heat absorption of said radiating plate at said maximum temperature of said radiating water.

9. A substrate cooling apparatus for cooling a substrate placed in position contacting or adjacent a cooling plate having cooling means, said apparatus comprising:

first set temperature storage means for storing, as a first set temperature, a target temperature to which said substrate is to be cooled;

second set temperature storage means for storing a temperature below said target temperature as a second set temperature; and control means for reading said second set temperature from said second set temperature storage means and controlling said cooling means to cool said cooling plate such that, by a point of time when said substrate is placed in position, said cooling plate is maintained at said second set temperature, and for reading said first set temperature from said first set temperature storage means and switching control of said cooling means at a predetermined time after said substrate is placed in position, to bring said cooling plate to said first set temperature.

10. A substrate cooling apparatus as defined in claim 9, further comprising:

temperature measuring means for detecting temperature of said cooling plate; and peak detecting means for detecting a peak of the temperature of said cooling plate detected by said temperature measuring means;

wherein said control means is operable, when said substrate is placed in position, to read said second set temperature from said second set temperature storage means and control said cooling means to cool said cooling plate to said second set temperature, and subsequently when the temperature of said cooling plate detected by said temperature measuring means reaches said peak, to read said first set temperature from said first set temperature storage means and control said cooling means to bring said cooling plate to said first set temperature.

11. A substrate cooling apparatus as defined in claim 9, further comprising:

timer means for measuring passage of a predetermined time after said substrate is placed in position;

wherein said control means is operable, when said substrate is placed in position, to read said second set temperature from said second set temperature storage means and control said cooling means to cool said cooling plate to said second set temperature, and subsequently upon lapse of said predetermined time after said substrate is placed in position, to read said first set temperature from said first set temperature storage means and control said cooling means to bring said cooling plate to said first set temperature.

12. A substrate cooling apparatus as defined in claim 9, further comprising:

substrate detecting means for detecting placement of said substrate in position;

wherein said control means is operable, before said substrate is placed in position, to read said second set temperature from said second set temperature storage means and control said cooling means to cool said cooling plate to said second set temperature, and subsequently when said substrate detecting means detects placement of said substrate in position, to read said first set temperature from said first set temperature storage means and control said cooling means to bring said cooling plate to said first set temperature.

13. A substrate cooling apparatus as defined in claim 9, further comprising:

input means for inputting an initial temperature of said substrate to be cooled; and a table memory for storing a plurality of temperature values as initial temperatures of substrates prior to cooling, and temperatures below said target temperature and corresponding to said temperature values as second set temperatures;

wherein said control means is operable, in response to said initial temperature inputted through said input means, to read a second set temperature corresponding to a temperature value of said initial temperature from said table memory to control said cooling means.

14. A substrate cooling apparatus for cooling a substrate placed in position contacting or adjacent a cooling plate having cooling means, said apparatus comprising:

temperature measuring means for detecting temperature of said cooling plate;

peak detecting means for detecting a peak of the temperature of said cooling plate detected by said temperature measuring means;

first set temperature storage means for storing a target temperature, as a first set temperature, to which said substrate is to be cooled;

lower limit temperature storage means for storing peak temperatures of said cooling plate at peaks of temperature increase reached after said substrate is placed in position, and lower limit temperatures below said target temperature and related to said peak temperatures; and control means for controlling said cooling means to cool said cooling plate to a predetermined temperature before said substrate is placed in position, controlling said cooling means at a predetermined high cooling output at a point of time when said substrate is placed in position, reading a lower limit temperature related to a peak temperature from said lower limit temperature storage means when the temperature of said cooling plate detected by said temperature measuring means reaches a peak, reading said first set temperature from said first set temperature storage means when said cooling plate reaches said lower limit temperature, and switching control of said cooling means to bring said cooling plate to said target temperature.

15. A substrate cooling apparatus as defined in claim 14, wherein said control means is operable, before said substrate is placed in position, to read said first set temperature from said first set temperature storage means as said predetermined temperature and control said cooling means to bring said cooling plate to said first set temperature.

16. A substrate cooling apparatus as defined in claim 14, further comprising:

preliminary cooling temperature storage means for storing a preliminary cooling temperature below said target temperature;

wherein said control means is operable, before said substrate is placed in position, to read said preliminary cooling temperature from said preliminary cooling temperature storage means as said predetermined temperature and control said cooling means to bring said cooling plate to said preliminary cooling temperature.

17. A substrate cooling apparatus as defined in claim 14, wherein said cooling means comprises Peltier elements; said apparatus further comprising:

radiating water temperature measuring means for detecting temperature of radiating water supplied to a radiating plate disposed at a radiating side of said Peltier elements; and duty ratio storage means for storing duty ratios related to a plurality of radiating water temperatures, said duty ratios being determined based on a maximum cooling power of said Peltier elements for a maximum temperature of said radiating water, and on a reference electric current outputted to said Peltier elements for driving said Peltier elements at said maximum cooling power at said maximum temperature of said radiating water, each duty ratio being of an electric current required to drive said Peltier elements at said maximum cooling power at a given temperature of radiating water, with respect to said reference electric current;

wherein said control means is operable, at the point of time when said substrate is placed in position, to detect through said radiating water temperature measuring means an actual temperature of said radiating water, to read a duty ratio corresponding to said actual temperature detected from said duty ratio storage means, and to control an electric current outputted to said Peltier elements in pulses under ON/OFF control based on said duty ratio read, thereby to drive said Peltier elements at said predetermined high cooling power.

18. A substrate cooling method as defined in claim 2, further comprising the step of inputting an initial temperature of said substrate to be cooled, wherein said temperature below said target temperature is determined in relation to said initial temperature.

19. A substrate cooling method as defined in claim 3, further comprising the step of inputting an initial temperature of said substrate to be cooled, wherein said temperature below said target temperature is determined in relation to said initial temperature.

* * * * *